(12) United States Patent
Wall et al.

(10) Patent No.: US 6,732,649 B1
(45) Date of Patent: May 11, 2004

(54) METHODS FOR PROVIDING CUSTOM RUBBER STAMPS

(76) Inventors: Alexander C. Wall, 988 Blvd. of the Arts, #617, Sarasota, FL (US) 34236; Llewellyn E. Wall, 92 Shadyside Ave., Concord, MA (US) 01742

( * ) Notice: Subject to any disclaimer, the term of this patent is extended or adjusted under 35 U.S.C. 154(b) by 240 days.

(21) Appl. No.: 09/671,804

(22) Filed: Sep. 28, 2000

Related U.S. Application Data

(60) Provisional application No. 60/156,405, filed on Sep. 28, 1999.

(51) Int. Cl.$^7$ .................................................. G03F 7/20
(52) U.S. Cl. .................................... 101/401.1; 101/333
(58) Field of Search ................................ 101/327, 333, 101/334, 395, 401.1; 430/306

(56) References Cited

U.S. PATENT DOCUMENTS

| | | | | |
|---|---|---|---|---|
| 4,714,957 A | * | 12/1987 | Takano | 101/401.1 |
| 5,152,223 A | * | 10/1992 | Mairon | 101/334 |
| 5,222,431 A | | 6/1993 | Kawahara | 101/128.21 |
| 5,253,579 A | | 10/1993 | Yoshii et al. | 101/401.1 |
| 5,259,311 A | | 11/1993 | McCaughey, Jr. | 101/401.1 |
| 5,275,919 A | * | 1/1994 | Kawatsuji et al. | 430/306 |
| 5,329,848 A | | 7/1994 | Yasui et al. | 101/121 |
| 5,336,585 A | * | 8/1994 | Takahashi et al. | 430/284 |
| 5,377,599 A | | 1/1995 | Wall et al. | 101/327 |
| 5,454,309 A | | 10/1995 | Fujikawa et al. | 101/128.21 |
| 5,460,757 A | | 10/1995 | Hedgecoth | 264/400 |
| 5,473,982 A | | 12/1995 | Hirata et al. | 101/125.4 |
| 5,582,105 A | | 12/1996 | Miki et al. | 101/128.4 |
| 5,595,112 A | | 1/1997 | Seo | 101/26 |
| 5,603,796 A | | 2/1997 | Baker | 156/272.8 |
| 5,611,279 A | | 3/1997 | Ando et al. | 101/401.1 |
| 5,660,668 A | | 8/1997 | Matheson et al. | 156/268 |
| 5,669,304 A | * | 9/1997 | Kuriyama et al. | 101/401.1 |
| 5,771,808 A | * | 6/1998 | Kuriyama et al. | 101/401.1 |
| 5,776,661 A | * | 7/1998 | Casaletto et al. | 430/306 |
| 5,915,299 A | * | 6/1999 | Kuriyama et al. | 430/306 |
| 5,957,053 A | * | 9/1999 | Hayama | 101/401.1 |
| 5,972,566 A | * | 10/1999 | Venkataraman | 430/306 |
| 6,030,743 A | * | 2/2000 | Okumura et al. | 430/203 |
| 6,095,046 A | * | 8/2000 | Lookholder et al. | 101/327 |
| 6,341,561 B1 | * | 1/2002 | Imamaki et al. | 101/327 |
| 6,422,140 B1 | * | 7/2002 | Lookholder et al. | 101/483 |
| 6,460,456 B1 | * | 10/2002 | Sugiyama et al. | 101/327 |

OTHER PUBLICATIONS

The Stamp Man, Internet Ordering Guide, Dec. 1997.*
"Stampcreator PRO (TM) Store Operations Manual" Brother International Corporation 100 Somerset Corporate Blvd., Bridgewater, NJ 08807–0911 (Date available to the public undertain).

* cited by examiner

Primary Examiner—Stephen R. Funk
(74) Attorney, Agent, or Firm—Mark Douma

(57) ABSTRACT

The present invention relates to an improved retail process and apparatuses for putting customized marking devices, commonly called rubber stamps, in the hands of a customer in a convenient period of time such as five minutes after data entry. Prior art processes make stamps in a batch mode, generally forming text on a separate rubber sheet, cutting the sheet, and adhering individual rubber stamps to stamp mounts taken from inventory. The instant process forms text and/or graphics on stamp mounts that are complete except for the marking data on the rubber and an index card. A special purpose one-stamp-at-a-time laser engraver can be used with the process. As an alternative, a multiple cavity fixture can be used in conjunction with existing laser engravers. A further alternative uses a photopolymer method of producing single stamps. In addition to a convenient time to fill an order for a customer, the instant process is directed toward reducing the number of manual steps and errors resulting from the prior art processes.

13 Claims, 18 Drawing Sheets

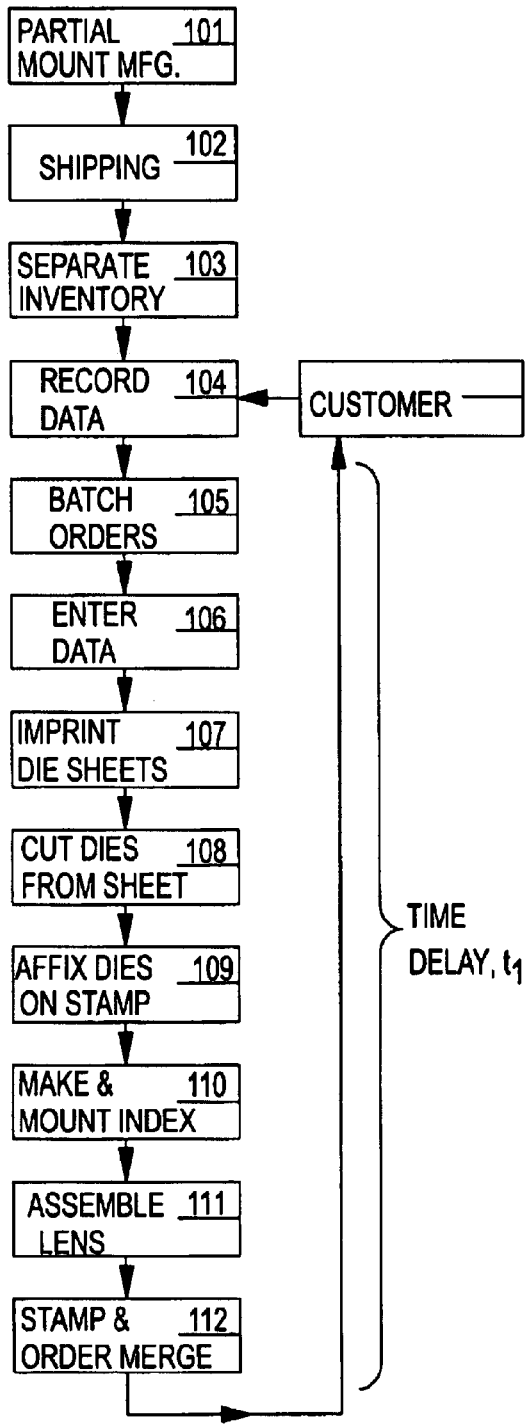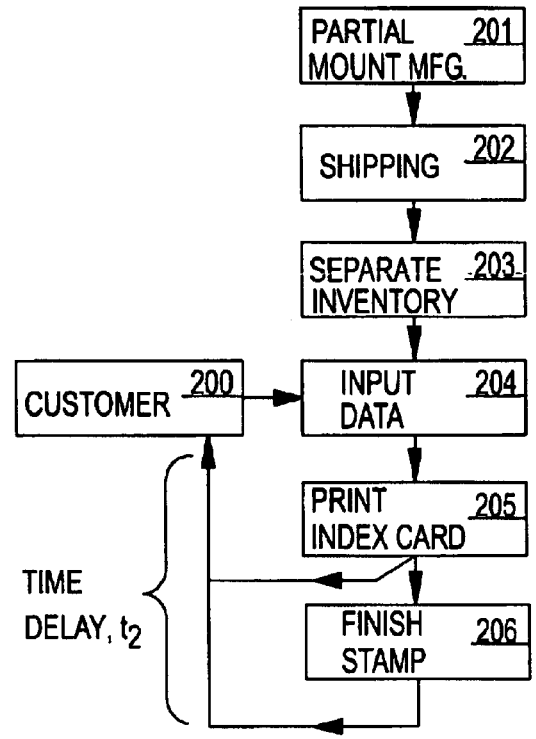

METHODS FOR PROVIDING CUSTOM RUBBER STAMPS

RELATED APPLICATIONS

This application claims priority from a provisional application, serial No. 60/156,405, filed on Sep. 28, 1999, incorporated herein by reference.

BACKGROUND

1. Technical Field

The present invention relates to an improved retail process and apparatuses for putting customized marking devices, commonly called rubber stamps, in the hands of a customer.

2. Background of the Invention

In the mid 19th century, a method of making a rubber printing die was developed. When mounted on a wooden block with a handle, together termed a mount, and pressed against a pad containing ink, it became practical to mark or write a message many times without a printing press. Identical wooden mounts were made automatically in large quantities. However, except for standard legends, e.g., PAID, the die on each stamp must be individually tailored for each customer. This is a unique requirement in a simple mass production product. Over 100 years ago, it was found to be more economical to make batches of 20 to 100 individual dies on a single sheet rather than make one die at a time. The sheet is cut with scissors and the dies are glued to mounts by hand. To complete the stamp, an index card that duplicates the text on the die is affixed to the mount and usually covered with a transparent plastic sheet or lens. This process has remained to the present day.

There are three main methods for producing rubber stamp dies. Today, these are carried out by about 4,000 small finishing shops with two to ten employees scattered around the country. In the original process, cold printing type is set in a bed of paper-mache that is then heated to form an accurate negative. This negative is filled with uncured rubber. Heat and pressure are applied to vulcanize the rubber to a strong elastomeric sheet of dies. Although the dies produce an excellent print, only a few shops continue to use this system as it is very labor intensive.

Currently, the most popular is the photopolymer method. Typically, an 8½×11 inch photonegative is filled with text (or graphics) from as many dies that will fit. This is used with UV light to illuminate the front of a planar cavity filled with a liquid photopolymer while the entire back is illuminated. Where exposed, the liquid turns into a strong elastomeric rubber leaving a solid back and a front with solid text. The liquid between the rubber text is washed away.

About eight to ten years ago, a method that uses a medium power carbon-dioxide laser engraver was introduced. Under computer control, a relatively large sheet of rubber (approximately 97 square inches) is engraved with the die information for as many dies as will fit. Adoption of this method has been retarded by the high price of the engraving apparatus, $20,000 to $50,000, but the cost is offset by the ability to engrave metal plaques and have less chemical wastes and be less labor intensive than the photopolymer method. The disadvantage of this method is that it takes 30 minutes to 2 hours, depending on the text, to engrave one sheet.

FIG. 1 illustrates a prior art process by which an end customer can obtain an individualized stamp using a laser engraver. (The photopolymer method is substantially the same save for the details of producing the type die.) First, a mount manufacturer, of which there are about a dozen large highly automated ones in the country, makes mounts 101 without dies attached and ships them 102 to a finisher. The finisher keeps a separate inventory of unfinished mounts and rubber sheets 103. A customer 100 orders a stamp and the finisher records the data 104. In some cases, the customer will order directly from the finisher, while in others, an order may be placed through an intermediary such as an office supply store. The finisher collects orders until enough are on hand to make an economical batch 105. When these are obtained, data is entered into a computer 106 that controls the laser engraver to imprint the data in the rubber sheets 107. After engraving, the sheets are cut 108 and affixed to the mounts 109. An index card is made and mounted 110 and covered with a lens 111. The last step is to match the completed stamp to the order and ship it or set it aside for pick-up 112.

As illustrated in FIG. 1, there is a time delay, $t_1$, between ordering a stamp and receiving it that depends on where the customer places their order and what method is used to make the dies. If ordered through an office supply store, $t_1$=several days. Some finishers, using the photopolymer method, promise an in by 10:00 am, out by 3:00 pm service, so that $t_1$=5 hours. A customer is, most likely, entirely unaware of the process by which a stamp is produced. However, the time delay is hard to miss. For business customers, stamp requirements are important enough so that the time delay is tolerated. For consumers for whom purchase of a stamp is more discretionary, the time delay probably causes the stamp making industry to lose considerable sales. Very few consumers purchase individualized rubber stamps.

The other aspect of the process that a customer notices is errors in the finished stamp die. Errors usually occur at the data entry step 106 and occur often enough to be a nuisance.

From the finisher's standpoint, the process requires a number of manual steps including: the recording of data from the customer, the inputting of that data into a computer, the cutting of individual type dies from a sheet after each batch is formed, selecting the appropriate stamp from inventory, mounting individual type dies on stamp bodies, printing and mounting index cards on the stamp bodies, identifying the finished stamp with the order, and delivery to the appropriate customers. Each of these steps introduces the possibility of errors creeping in. For instance, if a data entry is incorrect, the type die is incorrectly cut from the sheet, or is misaligned when mounted on the stamp body, the stamp is generally not salvageable and the finishing shop must start from scratch, waiting for a sufficient number of stamp orders to fill another sheet before making a replacement.

Several studies of end user preferences made by the Marking Device Industry Association have overwhelmingly shown that print quality, appearance, durability and convenience of purchase are always more important that price. It would seem that more progress would have been made with respect to convenience of purchase, even if the price were slightly higher.

Given that the process illustrated in FIG. 1 is a century old, one might assume that the stamp industry lacks innovative talent. However, in that time, marking stamps have been the subject of a large number of improvement patents on stamp articles and methods of making them. Many of these have been implemented so that the stamp of 1999 bears little resemblance to its 1899 predecessor. However, in order to reduce the time delay, errors, and labor costs, improvements to the process illustrated in FIG. 1 are required.

One of the improvements in stamps themselves is the development of the self-inking stamp. Since this invention is directed primarily to solving problems related to old fashioned rubber stamps and self-inkers, details of self-inker construction are pertinent. An exemplary self-inking marking device may be found in U.S. Pat. No. 4,432,281, issued Feb. 21, 1984, to Wall et al., incorporated herein by reference. In summary, these employ a simple ingenious mechanism comprising a top outer casing, a bottom casing inside, springs tending to separate the casings, and a platen on which is affixed a rubber stamp known as a "type die." An axle runs down the center of the platen on the side opposite the marking surface and engages a slot in the bottom casing. Springs normally keep the bottom and top casings separated with the marking surface contacting an ink pad inside the top casing. When the top casing is pushed down on the bottom casing, the axle is forced down the slot, but an indent in the bottom casing engages the platen and rotates it by 180 degrees so that the marking surface faces whatever is below the bottom end of the bottom casing. For storage convenience, tabs in the bottom casing can be used to "lock down" the platen with the marking surface at a position slightly above the bottom of the bottom casing. Releasing the tabs causes the marking surface to travel back up to the ink pad where the marking die normally rests and is pressing firmly against the ink pad for a fresh supply. Since the casings and platen can be made of plastic, the retail cost of even custom stamps ranges from as little as $10.00 for small marking surface sizes of about 0.5 square inches to about $60.00 for a 5 square inch size.

It should be noted that there are two other types of stamps that have been developed. The first uses a stencil covering an ink supply pad. The stencil is a thin film, usually of plastic, that, through a number of processes, has holes created in it corresponding to the desired text. When pressed down, ink is transferred through the holes to make a print. These have been available for many years, but none have proven commercially successful for several reasons. They are somewhat fragile and have a relatively short life. With some versions, the print quality is not good enough, especially if the surface is uneven or the stamp is not held perfectly flat against the surface. With other versions, the cost of the mount is too high.

The second, and more popular type, is the pre-inked stamp. Similarly to the UV-cured photopolymer stamp, heat is used to cure an ink containing gel on a back side and text on a marking side to form a stamp pad. These are less fragile than the stencil stamp, but are difficult to make. Over curing the gel will cause all the ink to run out, but under curing the gel causes it to wash away. They also require special inks that tend to bleed through ordinary paper.

In short, the self-inker type has, by far, the largest share of the market.

SUMMARY

Accordingly, a major object of the present invention is to provide a retail process wherein a customer can order an individualized rubber stamp and receive a finished working stamp in a conveniently short period of time such as ten minutes or, more conveniently, five minutes or less. Another object is to reduce the manual labor and resulting errors in finished stamps. Still another object is to provide apparatuses with relatively low capital costs that can be used to carry out steps in the process.

In one embodiment of the invention, these objects are realized in a process wherein a customer, in a retail point-of-sale setting, with or without operator assistance, inputs data to a computer and confirms the accuracy and layout. After this step, an operator places a selected stamp, finished in all respects except for engraving and affixing an index card, in a special purpose laser engraver to engrave the type die. As an alternative or addition, the computer causes a printer to print the index card and this is used to check the data input and later affixed to the stamp.

Although not essential, the almost finished stamps should preferably have type dies affixed by high-speed, automated machines, so that the mounts are completely assembled and no further assembly operations arc required. If not available, part of this objective can be realized by obtaining blank type dies pre-cut by machine and affixing them by hand.

The present invention utilizes a novel special purpose engraver suitable for engraving type dies on stamps, one at a time, having a drive mechanism that moves the stamp horizontally, a suitable engraving laser with a vertical drive, and a control that causes the stamp and laser to move such that the laser beam performs a raster scan over the type die. The laser is turned on and off to transfer marking data to the type die that has been inputted into a memory in a controller.

Until the aforementioned laser engraver is widely available, the invention can utilize a fixture that can be used with existing laser engravers to individually engrave type dies affixed to stamps. The multiple cavity fixture accepts stamps of various sizes, keeps the type dies on the stamps oriented for engraving, detects the size or absence of stamps, and relays this information to a computer. The fixture can be used to make stamps in a batch mode, but engraving can be interrupted to finish a single stamp in two to three minutes.

In contrast to the prior art methods, the novel stamp finishing system of the present invention requires little manual labor and enables a customer to receive a custom stamp within approximately five minutes of the time a customer finishes inputting data. As noted above, conventional stamp finishing shops receive semi-assembled stamp bodies and components from stamp manufacturers, engrave the marking surfaces for each stamp according to customer specifications, and complete the assembly of the stamps. The novel stamp finishing system of the present invention takes fully assembled stamps which require only engraving of the type die and printing of the index label, and completes these two final steps in a fully automated fashion.

Most of the objectives of the invention can be realized utilizing a method that does not require a laser engraver. This method uses a light curable photopolymer that is illuminated through a photonegative to form a rubber-type die with raised markings. A single die cavity is used so that, after curing, the die is ready to be placed onto the platen of a stamp body, preferably, a self-inker. The making of a single die means that the cured rubber does not have to be cleaned and cut into individual dies. The back of the die remains tacky and can be adhered to a stamp platen without additional adhesive. Adhesion is adequate, but no so strong that the die cannot be removed and repositioned without damage. More labor is involved, but the time for a customer to receive a finished stamp is still less than about five minutes. Some overall labor can be saved by using a disposable die cavity.

Further features and advantages of the present invention as well as the structure and operation of various aspects and embodiments of the present invention are described in detail below with reference to the accompanying drawings.

BRIEF DESCRIPTION OF THE DRAWINGS

The objects and advantages of the present invention will be more clearly understood when considered in conjunction with the accompanying drawings, in which:

FIG. 1 is a flow chart illustrating the conventional prior art process by which a customer can obtain a stamp;

FIG. 2 is a flow chart illustrating the process of the present invention;

FIG. 3b is a schematic plan view of the stamp engraving apparatus illustrated in FIG. 3a;

FIG. 10b shows one orthogonal cross-sectional view of a stamp in one cavity of the fixture illustrated in FIG. 10a;

FIG. 10c shows another orthogonal cross-sectional view of a stamp in one cavity of the fixture illustrated in FIG. 10a;

DETAILED DESCRIPTION OF THE PREFERRED EMBODIMENTS

Figure 3A:
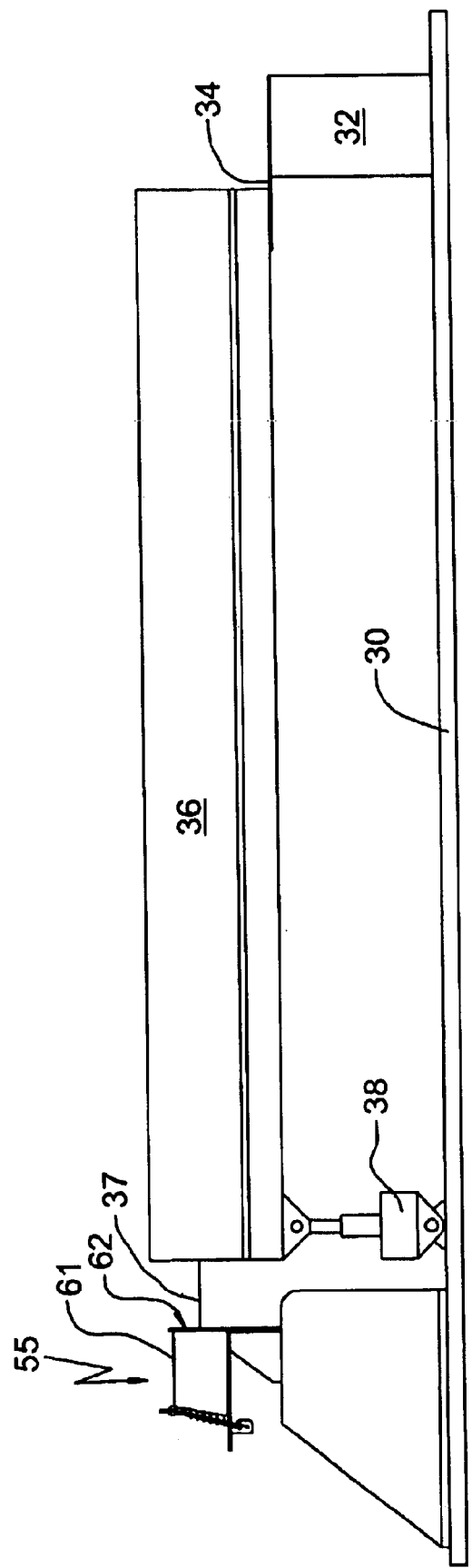
FIG. 3a is a schematic elevation view of one illustrative embodiment of a stamp engraving apparatus suitable for use with the process of this invention.

A method that uses a laser engraving machine will be described first, followed by one that uses light curable photopolymers. As illustrated in FIG. 2, the present invention is a radical departure from the process through which customers can obtain stamps. In order for this process to work best, mount manufacturers would assemble mounts with blank dies adhered to the platens 201. After shipping 202, the finishers will have an inventory of unitary stamps 203 with already affixed blank type dies as an integral unit at a point of sale outlet. The outlet could be a new type of retail outlet that can finish stamps or a traditional finisher.

After a customer 200 selects a particular stamp, the customer or an employee at the outlet enters marking data, text and possibly graphical information, into a computer 204. This information is printed on an index card for proofreading and given to the customer for approval 205. If correct, the selected stamp is placed in an engraving machine that produces text on the blank type die and the stamp is handed to the customer 206. Optionally, the customer can affix the index card to the stamp, along with a lens. Since a display screen could be used for error checking, making an index card is not essential, but a finished stamp without one would be unusual.

Presupposing a suitable engraving machine, one of which will be described below, this process has two major advantages. From the customer's standpoint, it will be possible to complete the process in a convenient period of time such as ten minutes or, more preferably five minutes. From the retail stamp suppliers standpoint, the number of steps, especially manual ones, have been dramatically reduced, saving on both labor and preventing mistakes. Thus, the cost can be lower.

A more subtle benefit is that affixing the type dies to the stamp bodies as part of the mass production step eliminates the problems of badly cut, improperly affixed, or misaligned type dies in the currently used processes, all of which result in significant delay and customer dissatisfaction. Mass producers can also use more permanent adhesives that will eliminate the common problem of type die slippage over time.

Until mass producers have changed their manufacturing practices, as a less desirable but still viable alternative, the retail outlet can buy stamp bodies as usual and apply pre-cut blank type dies. If a mistake is made in this step, at least an investment in engraving is not lost.

Another alternative is to print the index card after engraving the stamp. This approach would be taken when, e.g., the data input is from a remote location such as an order placed over the Internet.

In all these embodiments, engraving is carried out directly on a stamp having an attached blank type die.

Figure 3B:
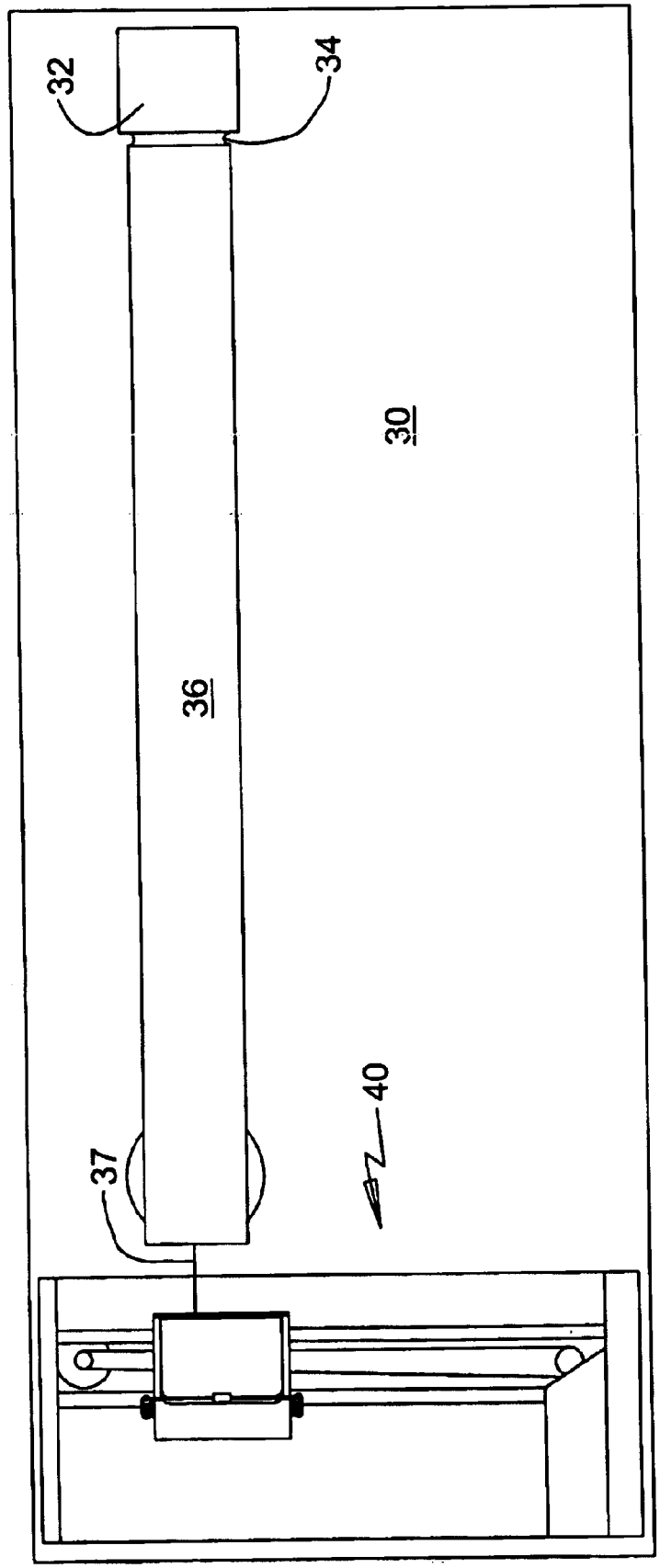

The prior art methods of producing type dies are not suitable for the improved method of this invention; different approaches to a stamp finishing system are required. One is illustrated in FIGS. 3a and 3b. The system comprises a base plate 30 having a laser 36 and a drive assembly 40 situated thereon. The base plate 30 is preferably horizontal, although other embodiments of the invention may involve alternative configurations. The base plate 30 may be a rigid rolled sheet of 6061 aluminum, having a thickness of approximately 0.5 inches, a length of about 48 inches and a width of about 20 inches. This 0.5 inch plate is relatively inexpensive, adequately stiff, and easily machined to a high degree of accuracy. In an alternative embodiment of the present invention, the base plate 30 may be fashioned in any appropriate manner known in the art, and may have any dimensions necessary to support the desired stamp finishing system.

Atop the drive assembly, is a stamp carrier assembly 55 having a mounted stamp 61 with a type die marking surface 62 facing the laser output beam 37. The laser 36 is a laser capable of engraving rubber, such as the Model 48-2 laser, a 25 Watt carbon dioxide air-cooled device made by Synrad, Inc., Mukiltee, Wash. The Synrad Model 48-2 is approximately 33 inches in length, with a cross section of approximately three inches by four 5 inches. It should be noted that the nominal 0.04 inch laser beam 37 is converged with long focal length lenses to an approximate beam diameter at its waist of about 0.002 inches that is focused on the type die. This provides the power density to vaporize the rubber type die. The choice of laser is not limited to this model; any having the requisite power density may be used.

As will be explained in detail below, the function of the drive assembly 40 is to move the stamp carrier assembly 55 in the horizontal (hereinafter denoted as the "x-direction") while the laser output beam 37 is moved in the vertical (hereinafter denoted as the "y-direction"). In this way, the laser beam performs a raster scan over the type die. Engraving is accomplished by modulating the laser output as a function of position on the type die.

Movement of the laser in the y-direction is accomplished with a stepper linear driver 38 that supports the output end of the laser. Incremental movements of approximately 0.001 inches per step are thought desirable. Other available methods of incrementally raising or lowering the laser are possible.

The back end of the laser 36 (i.e., the end of the laser distal from the output beam 37) is mounted on a pedestal 32 with a flexure spring 34. Alternatively, the back end of the laser may be attached to the pedestal 32 by a hinge, or by any other appropriate connector. However, a flexure spring is preferred because it provides lateral stiffness and hinders shaking of the laser during operation. The heights of the pedestal 32 and the stepper linear driver 38 are chosen to optimally position the laser 36 relative to the marking surface 62. Preferably, the laser is positioned substantially perpendicular to the plane of the marking surface and is pointed to locate its beam substantially at the center of the marking surface to minimize the error when the laser is tilted to engrave the full width of the marking surface. This error is introduced because, when the laser is tilted, the emitted laser beam is no longer perpendicular to the marking surface and therefore does not make a perpendicular cut. However, since the pivot point at the pedestal 32 is so far from the marking surface 62, the angle to cover typical type die sizes of ±0.75 inches is only about ±1.5 degrees and the error introduced in the engraving of a single marking surface to a depth of 0.04 inches appeared in an experiment to be only approximately ±0.0005 inches. This is three times smaller than the typical resolution of ±0.0015 inches (300 dots or lines per inch) required.

If particular applications require elimination of this error, the laser may alternatively and advantageously be attached to the base plate 30 in a translatable fashion, so that the entire laser is moved relative to the marking surface 62, rather than being tilted. One such embodiment results from the replacement of the pedestal 32 and the flexure spring 34 with a stepper linear driver similar to 38 to support the back end of the laser. In this embodiment, the stepper linear drivers supporting the front and the back of the laser are synchronously stepped, so that the laser 36 remains substantially parallel to the base plate 30 and perpendicular to the marking surface 62 at all times.

Alternatively, the error introduced by tilting the laser could be controlled by varying the convergence and divergence of the focus point of the laser beam. In such an alternative embodiment, the beam 37 emitted by the laser 36 is slightly less focused at greater tilting angles, allowing enough spread of the laser beam to compensate for the error otherwise introduced. The cut made by the laser in the marking surface 62 may thus be kept substantially perpendicular to the marking surface. This embodiment requires a simple additional computer control that could easily be implemented by those skilled in the art.

Returning to the preferred embodiment of the present invention shown in FIGS. 3a and 3b, the flexure spring 34 is chosen to enable the laser 36 to achieve an angular displacement of approximately ±1.5 degrees relative to its default position, substantially perpendicular to the marking surface 62. This flexure is well within the elastic limit of stainless steel spring stock approximately 0.02 inches in thickness.

Figure 4:
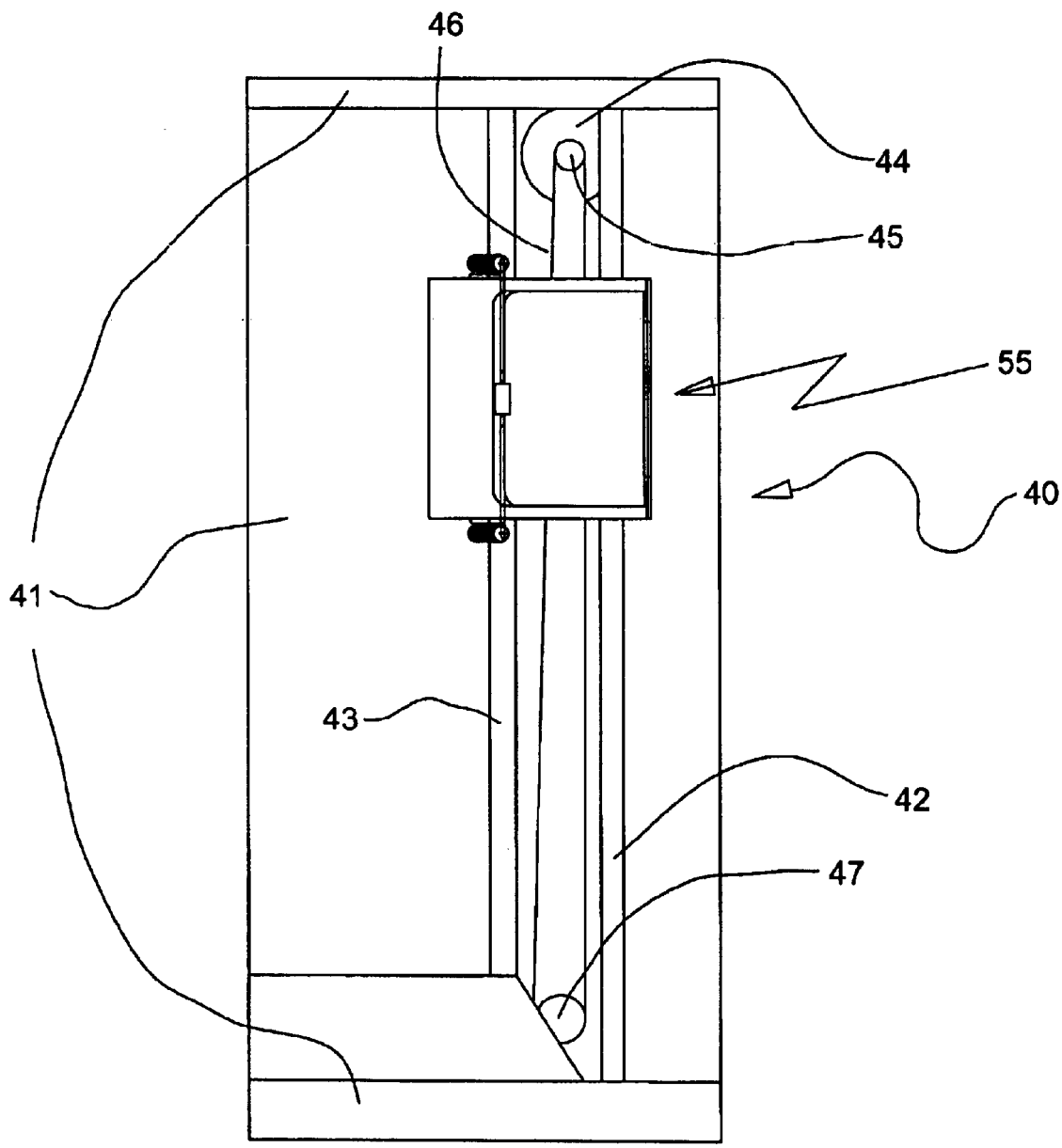
FIG. 4 is an enlarged schematic plan view of a drive assembly associated with the stamp engraving apparatus of FIGS. 3a and 3b.

FIG. 4 illustrates the drive assembly 40 in more detail. This assembly is very similar to that used in an inkjet printer sold at retail by Hewlett Packard Co., Lexmark International, Inc., and others. An inkjet printer could be purchased and adapted for use in the present invention by, in essence, replacing the ink cartridge with a stamp carrying assembly.

The drive assembly 40 moves the stamp carrying assembly 55 in a direction substantially perpendicular to the laser 36 and parallel to the base plate 30 to produce the x-direction motion of the raster scan of the marking surface 62 by the laser 36. The drive assembly 40 is conveniently contained within a U-shaped frame 41. A cylindrical stamp carrier assembly slide bar 42 and a rectangular guide rail 43 are positioned lengthwise in the frame 41 with their ends secured in the sidewalls of the frame. These components support and guide the stamp carrying assembly as it travels in the x-direction. The drive assembly further comprises a motor 44 secured to one sidewall of the frame. An output shaft of the motor is attached to a cog wheel 45 that drives a cog belt 46 that loops around an idler pulley 47 located proximate to the opposite sidewall of the frame. Moving the stamp carrying assembly 55 is accomplished by attaching one side of the drive belt 49 to it.

The position of the stamp carrying assembly is measured with a linear encoder and other sensing apparatus (not shown). Inkjet printers routinely provide a printing resolution of 300 dots per inch (dpi) that is adequate for the laser engraver of the present invention. In fact, using a modified retail inkjet printer is convenient because the software for driving the carriages of such printers is well understood.

Figure 5:
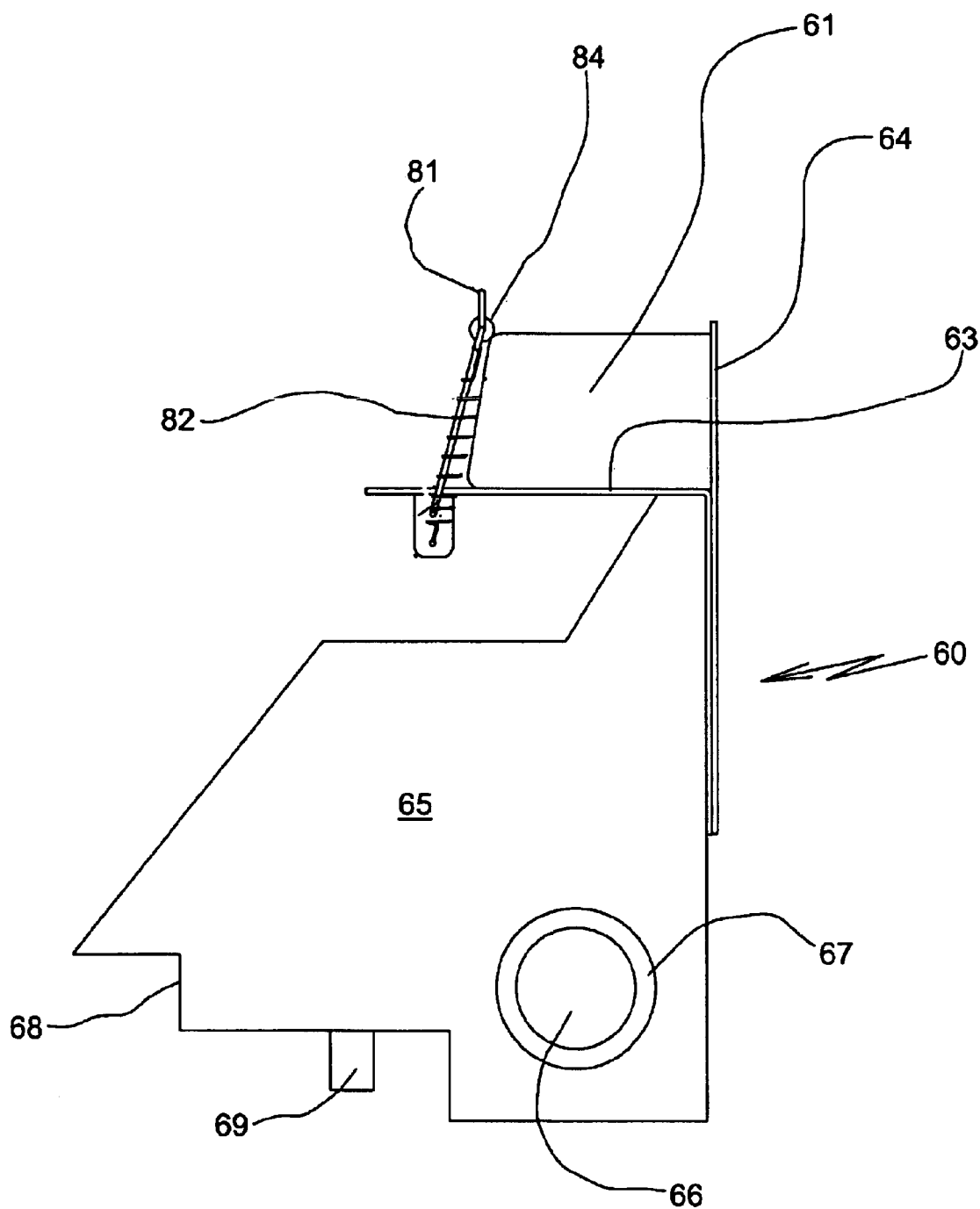
FIG. 5 is an enlarged schematic elevation view of a stamp carrier assembly that rides on the drive assembly illustrated in FIG. 4.

FIG. 5 shows a side view of a stamp 61 in a carrying assembly 60. A block 65 has a passageway 66 lined with a low friction bushing 67 for the slide bar 42. Another passageway 68 encompasses two sides of the guide rail 43. A tang 69 is attached to the cog belt 46 so that the assembly moves with the cog belt. Attached to the block 65 is a thin L-shaped plate 63 that forms a platform for the stamp 61. Another thin plate 64 is attached to the plate 63 and forms a front stop for the stamp. A bail 81 that is a wire frame having two sides (one not shown), the ends of which are attached to tangs on the plate 63, and a horizontal section connecting the sides, has a cylinder 84 positioned in the middle of the horizontal section. Springs 82, one for each side of the bail 81, are connected on one end to the horizontal sections of the bail 81 and on the other end to the tang on sheet 63, but closer to the stamp 61 than the attachment point of the bail 82.

In order to place a stamp in the assembly 60, an operator pulls the bail 81 away from the stamp position, places the stamp against the plates 63 and 64 and pushes the bail against the stamp. The springs 82 maintain the stamp in position during engraving. The position with respect to the carriage 40 must be known in order for the controller to know where the die surface is. Fixing a front corner of the stamp body with respect to the plate 63 should be adequate and easily designed for. In order to reduce operator error, it may be advisable to have sensors that indicate when a stamp is out of position. Implementing these is also believed to be a routine engineering exercise.

Figure 6:
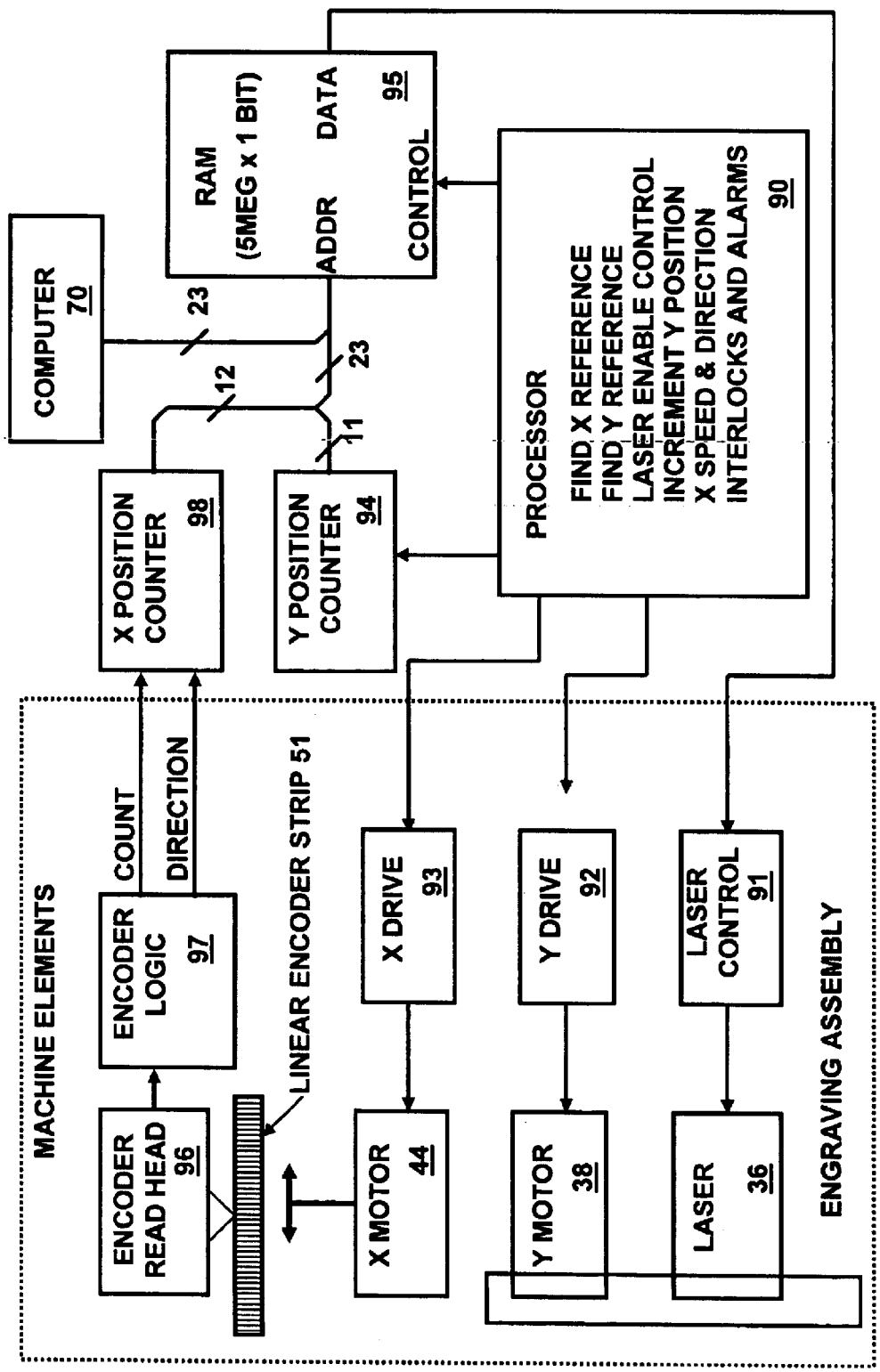
FIG. 6 is a schematic block diagram illustrating one preferred embodiment of control elements for the stamp finishing system associated with the present invention.

FIG. 6 illustrates additional functional elements required in order to engrave a stamp. Overall control is provided by a processor 90. The processor 90 is connected to: 1) a laser control 91 that turns on the laser 36 and modulates the laser output beam 37, 2) a y-axis drive 92 that drives the y-axis motor 38, 3) an x-axis drive 93 that drives the x-axis motor 44, 4) a y-position counter 94, and 5) a random access memory (RAM) 95.

This illustration assumes, as is commonly the case, that the drive assembly has a linear encoder strip 51 with an associated encoder head 96 and electronics 97 to detect the position of the carrier assembly 55. Thus, every time the stamp carrying assembly 55 moves by the equivalent of one half of a code bar, an electrical signal corresponding to one count and the direction of travel is produced. These are transmitted to the x-position counter 98. If the y-drive is a stepper motor, then the processor need only deliver a signal to the y-position counter 94 every time it commands the y-axis motor to move one step. The two counters 98 and 94 form an x-y address that is transmitted to the RAM 95.

Before engraving a stamp, the computer 70 loads an image bit map into the RAM 95. Then, starting from a reference position (this requires additional elements not shown or described because implementation would be routine) the processor causes the stamp carrying assembly to move in the x-direction over the length of the type die. During this time, the x-position counter 98 changes the address in the RAM 95 and data is read out corresponding to the image bits at those addresses. The value for each address is either a zero or one; the laser is correspondingly turned off or on. At the end of one scan in the x-direction, the processor moves the laser in the y-direction by one step incrementing the y-address by one bit and the x-scan is repeated with a new set of image bits corresponding to that y-axis position on the type die.

Thus, the motion of the laser beam relative to the type die marking surface that is engraved is that of a "raster scan" consisting of a set of lines parallel to the x-axis spread over the y-dimension of the surface. Motion of the stamp carrying assembly 55 in the x-direction may be either "unipolar" or "bipolar." In unipolar motion, engraving is performed only when the marking surface 62 is moved in one direction relative to the laser beam 37. In bipolar motion, engraving is performed in both the back and forth directions. In an embodiment directed towards increased speed, bipolar motion is generally preferred, and in an embodiment directed towards better quality marking, unipolar motion is generally preferred because it reduces backlash. The controlling means depicted in FIG. 6 can support either type of motion.

In a preferred embodiment of the present invention, the x-axis is parallel to the longer edge of a rectangular marking surface 62 on a stamp body 61, and the y-axis is parallel to the shortened edge of the rectangular marking surface, but this is not essential.

If desired, text may be produced in the type die below the printing surface. Although it would not print, it would be visible and can be used for production control.

Implementation of the controller may be further explained with reference to FIG. 6. The components inside the dotted box of FIG. 6, generally termed machine elements, are hardware devices (electronic, optical, and mechanical) contained within the physical casing of the system. Typically, the processor 90 would be a simple interface card plugged into a slot in the computer 70 working with software inside the computer, but it could be a standalone unit.

As will be understood by one skilled in the art, a number of safety and environmental control devices are needed in any embodiment of the present invention. For instance, laser engraving of rubber produces smoke and gaseous residue which must be removed from the machine and transmitted to a waste disposal means. Herein, the figures show no casings, covers, interlocks, vapor entrapment or related elements. Similarly, no electrical equipment such as power supplies and cords has been shown. These omissions are for ease of viewing, since one skilled in the art could routinely supply these features to any embodiment described herein.

Figure 7:
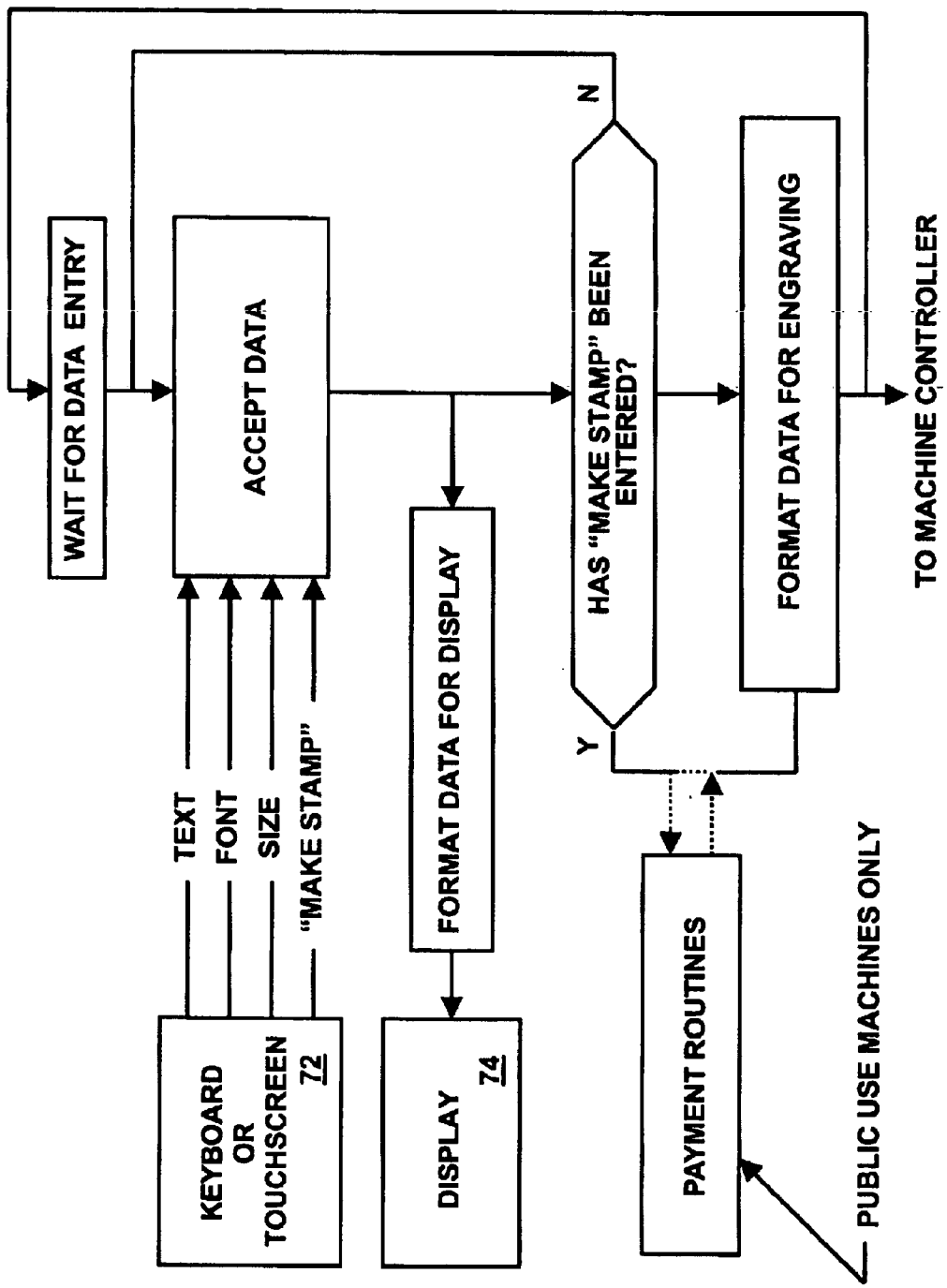
FIG. 7 is a schematic flowchart of one embodiment of the software which controls the operation of the stamp finishing system associated with the present invention.

FIG. 7 illustrates the operation of the software associated with the stamp finishing system. The machine first waits for data entry, as shown, from computer 72. During this step, the display 74 shows an operator (a retail customer or a store employee) directions and an options selection. In an embodiment configured for unattended public use, the option of payment by credit card may be provided. In an embodiment configured for commercial use, billing and customer information may be displayed.

At the first use of a data entry mechanism such as the keyboard or touch screen 72, the machine begins to accept data entry, and, on the display 74, depicts an image of what the marking surface 62 would look like when formed according to the operator's specifications. This display 74 is updated as data is input by the operator. In a preferred embodiment, the font and type size may be changed at any time by conventional means. The software also analyzes the data input to ensure that the proposed image fits on a marking surface 62 of the selected size. Alternatively, the computer could generate a display with a boarder showing the marking surface. The operator would then fit the text within the boarder. After all data has been entered and formatted, the operator presses a "Make Stamp" selection and the machine begins to format the data for use by the controller illustrated by FIG. 6.

In a preferred embodiment, before engraving-starts, an index card is printed so that the customer or an operator can check a hard copy of what would be engraved. Not only would this be helpful for those who have trouble reading monitor screens, but, when the stamp is finished, the index card can be immediately affixed to the otherwise finished stamp.

While current customers do not consider the cost of stamps as the most important attribute, it is still important for a wider customer base. In that regard, the capitol equipment cost of the disclosed engraver is believed to be considerably less than that for current systems. The major cost is that of the laser which is $5,000 when purchased one-at-a-time. Lower power lasers could be used to save money at the expense of more time to engrave. A 25 watt laser could engrave the average four line address stamp in less than three minutes. A 10 watt laser would cost $2000, but take ten minutes. Less than 10-watt lasers would not be desirable, because there is not enough power to overcome heat conduction from the type die to the stamp body.

Similarly, although not essential to using the method and apparatus, stamp body manufacturers can easily modify their assembly machines to produce stamp bodies with type dies already affixed. It is anticipated that this can be accomplished by simply altering the station at which adhesive strips are conventionally attached to the stamp platen for later manual adhesion of the type dies. Instead, this station will receive a hopper feed of pre-cut, blank type dies which will be affixed with an appropriate cement in lieu of the adhesive strips. This modification will not be expensive since a new station is not required. The suggested additional step is not an additional one as the unmodified station already assembles a die adhesive strip to the stamp body.

Figure 8:
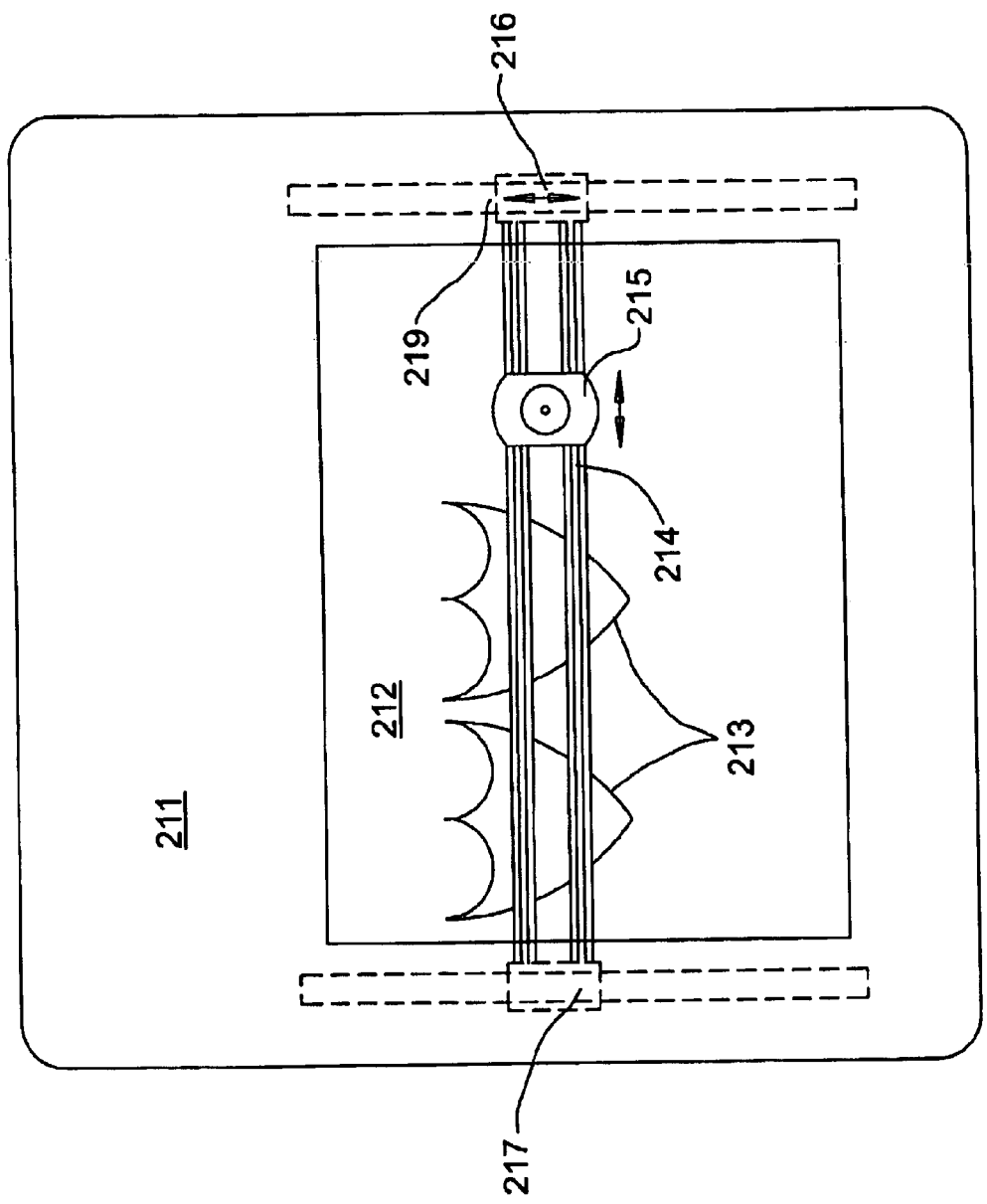
FIG. 8 is a schematic plan view of a commercially available laser engraver.

While the previous apparatus may be preferable in many respects, it may take some time before it becomes widely available. Another apparatus suitable for use with existing laser engravers is disclosed. FIG. 8 shows the top view of the rudiments of an existing laser engraver. A stationary table 211 is covered with material to be engraved 212. In the figure, a metal plate on which plaques 213 are being engraved is used for illustration. Two parallel rails 214 carry a laser head 215 that can move along the rails. The rails 214 are attached to ends 216 and 217 that are designed to move together along rails 219 in a direction orthogonal to the movement of the laser head 215. The laser beam (not shown) is arranged to be located under one of the ends, e.g., 217, perpendicular to the rails. A mirror (not shown) is located under end 217 and travels with it. The mirror intercepts the laser beam and directs it up to another mirror inside 217 that, in turn, directs the laser beam to the laser head 215 that, in turn, directs the laser beam to the work piece 212. As can be imagined, all three mirrors are at approximately 45 degrees to the plane of the table 211. An example of a commercially available laser engraver is the Model RSL-1824 available from M&R Marking Systems, Inc., Piscataway, N.J.

Figure 9:
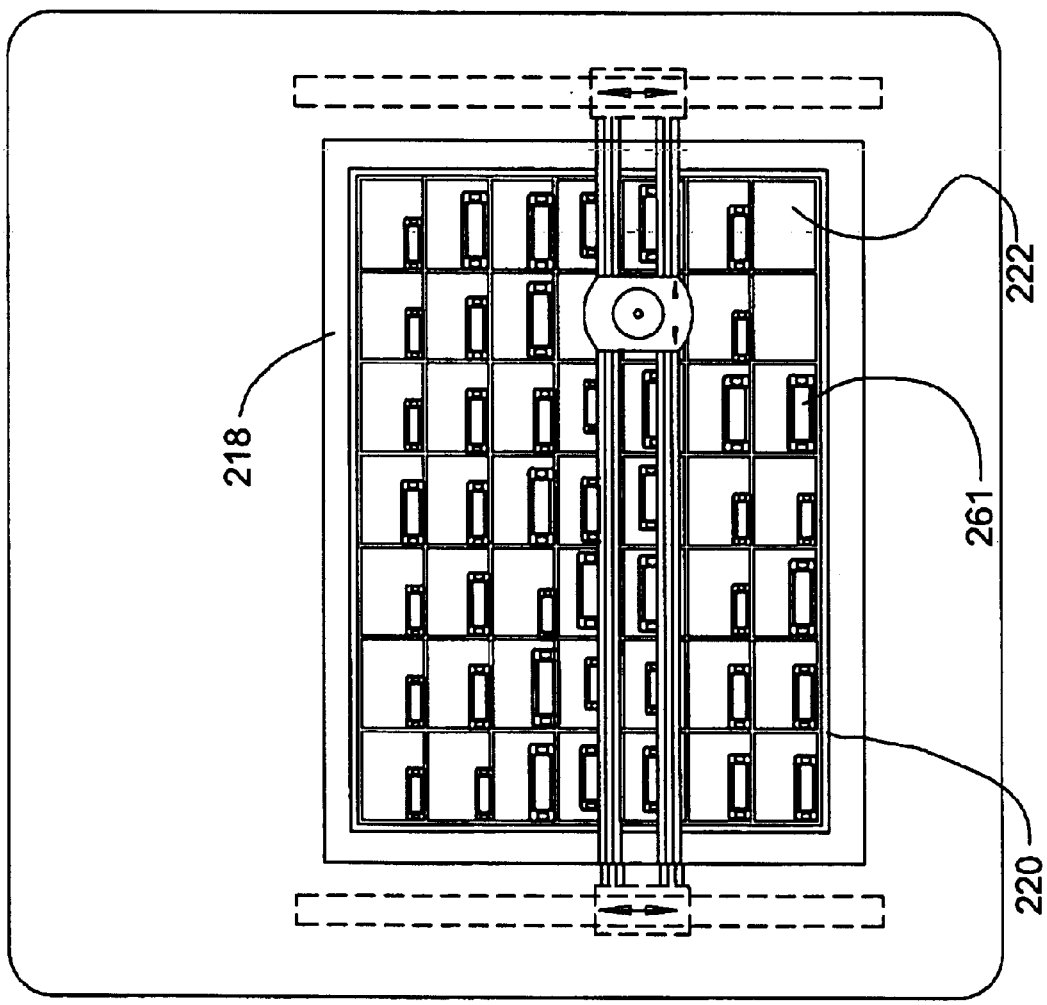
FIG. 9 is a schematic plan view of the laser engraver illustrated in FIG. 8 having a multiple cavity fixture covering a work area.

FIG. 9 illustrates a multiple cavity fixture 220 that can be used in conjunction with a commercial laser engraver to produce either one finished stamp at a time or a batch of finished stamps. It somewhat resembles an egg crate with cavities 222 for each stamp 261. In the illustration, 49 are shown, as, for the size of stamp mounts envisioned, this would fill the working area 218 of a standard laser engraver. However, the number is not critical.

Figure 10A:
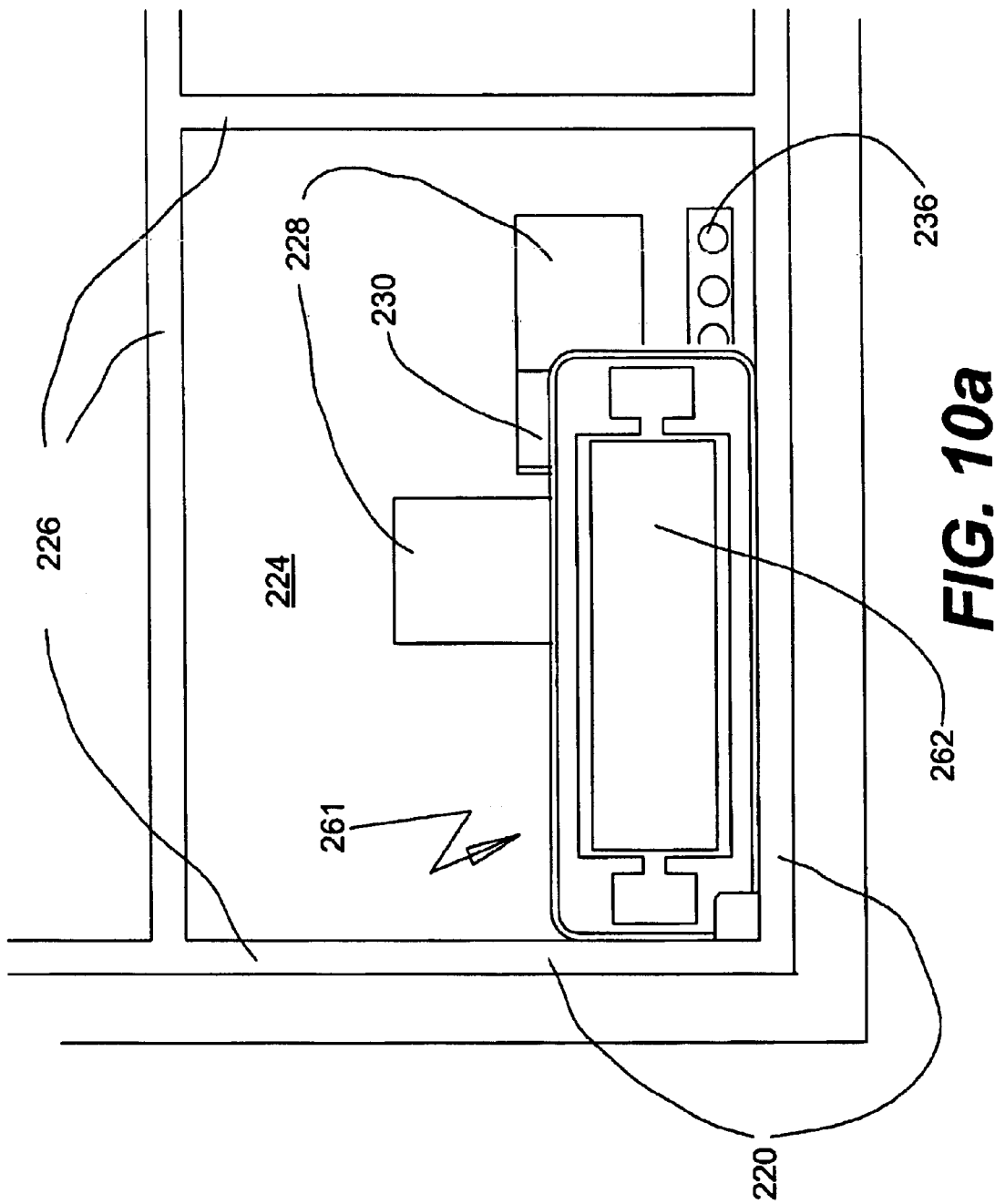
FIG. 10a is a top view of a stamp in one cavity of the fixture illustrated in FIG. 9.
Figure 10C:
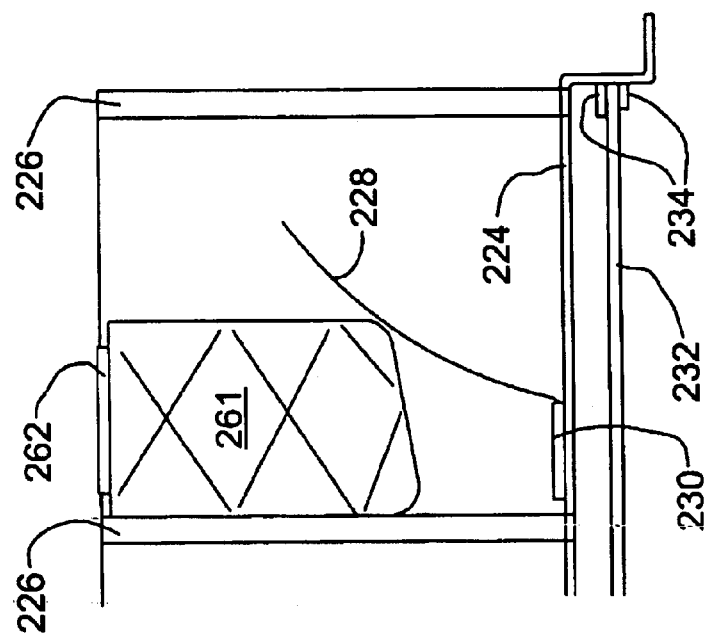
Figure 10B:
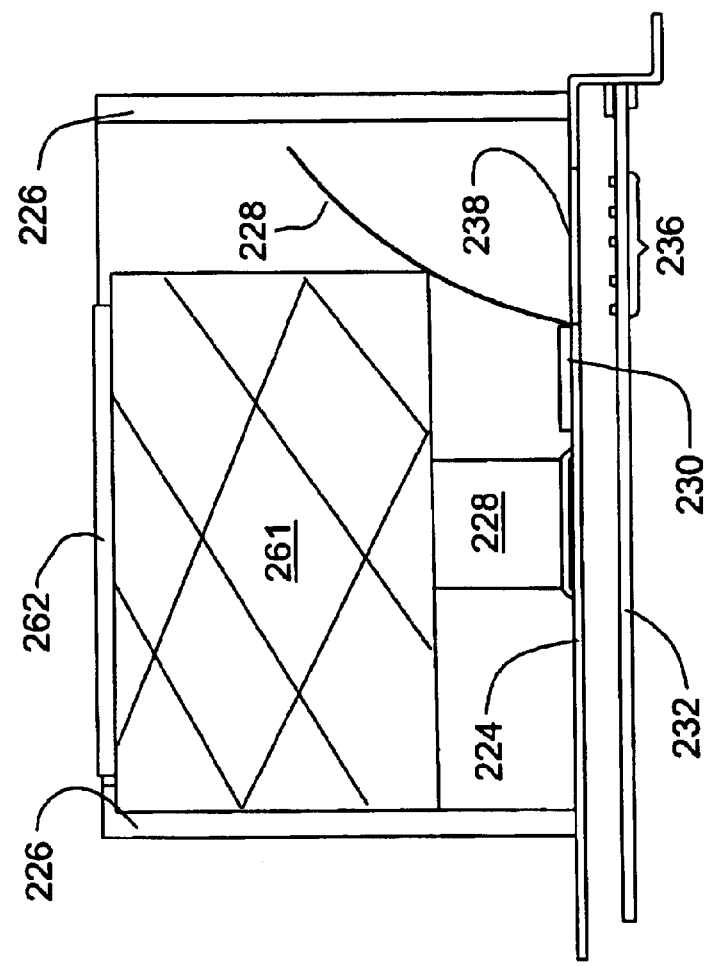

The critical aspect is the handling of finished mounts that are more cumbersome than flat sheets. FIGS. 10a, 10b, and 10c illustrate a single cavity, in a top and two cross-sectional views, respectively, on one corner of the fixture 220. There is a bottom plate 224 and cavity walls 226. A stamp 261 is held against one diagonal corner by flat springs 228 attached to the bottom plate 224 by raised perforations 230. The springs 228 must be strong enough to maintain the position of the stamp 261 and hence the marking surface of the die 262 in a precise known position throughout engraving. These springs 228 may be made out of beryllium copper, about 0.5 inches wide and 0.01 inches thick or any other suitable material.

Underneath the bottom plate 224, is a printed circuit board 232 that is attached to the skirts of the bottom plate with tangs 234 or any other suitable means. Mounted on the printed circuit board, are five laser sensors 236 that are visible to the laser through a hole 238. The printed circuit board 232 caries electrical connections to the laser sensors. Since laser engravers use carbon dioxide lasers with a wavelength of 10.6 $\mu$m, visible photodiodes cannot be used as sensors. However, inexpensive, heat sensitive resistors (thermistors) can be used. The response time is not fast for repetitive pulses, but, as will be described, this is not necessary.

When using the fixture 220 in a batch mode, a computer prints out the number of stamps of various sizes as a result of the data input on stamp orders. The stamps may be of mixed sizes and all cavities need not be filled.

After filling the fixture 220 with stamps 261, the fixture is set on the work area 218 in a precise location. Imprecision primarily affects the margin around text on the dies so that a 0.01 inch tolerance should be adequate. More precision can be obtained using locator pins and holes in the fixture 220. The engraver is then directed to make a calibration scan of the entire fixture. This is a quick pass over each cavity that only goes over locations where the laser sensors 236 are located. Taking into account the rate of travel, the laser beam 37 power should be adjusted to heat the laser sensor just enough to get a detectable signal.

If the laser sensors are able to cool quickly enough, all of them can be connected to one pair of leads. Since the controller knows where the laser beam is at all times, when a signal is detected, it can determine which laser sensor generated it. If the lasers sensors do not cool fast enough, simple circuitry for each sensor could be used to generate a pulse on a common signal line that lasts less than the time for the laser head to reach the position of the next sensor. Since the speeds are not great, other electronic arrangements are easily realized. Since these calibration scans are done only once when the fixture is mounted, there should be sufficient time for all laser sensors to cool in the interim.

The purpose of the scan is to determine which cavities are filled with which size stamp or no stamp. Five laser sensors, located to be covered by successively larger stamps, are enough for four different size stamps and no stamp. With the collected information, the controller can then determine if the fixture was correctly loaded. If there were no errors, the controller then automatically engraves each stamp. Using this fixture 220 simplifies inventorying in step 103 and eliminates the steps of die cutting and affixing in steps 108 and 109. It also should eliminate wasted stamps that occur as a result of these last two steps.

With this fixture, it is a simple matter to reduce the time delay for selected customers. If a customer wants a stamp in a hurry while the engraver is working on a batch of stamps, the operator can stop the engraver, place the desired stamp size in a cavity, have the engraver finish that stamp, and then have the engraver continue from where it left off. Even in batch mode, engraving can be prioritized and, assuming suitable safety interlocks, the operator can remove stamps as they are finished, filling the cavities with stamps for new orders, without stopping the engraving process. The entire batch can be re-prioritized at any time. This is impossible when dies are cut from a single sheet.

If these operations take place in a back room, from the standpoint of the customer 200 illustrated in FIG. 2, the process illustrated in the figure will appear to be the same as that for the dedicated apparatus disclosed above and the delay time $t_2$ should be less than about five minutes. This is because this fixture will be used by finishing shops having higher power lasers and the actual engraving time will be two to three minutes for an average address stamp.

In some situations, the investment in a laser apparatus may be undesirable. Therefore, another embodiment of the invention instead uses a photopolymer method to produce a type die. In this method, a photopolymer gel layer is illuminated through a photonegative to produce hard rubber text on one side and a solid rubber back on the other. FIG. 1, discussed above, also illustrates the current approach to providing stamps to customers using the photopolymer method. The embodiment described below provides an exposure assembly that is capable of carrying out the improved process illustrated in FIG. 2.

Figure 11:
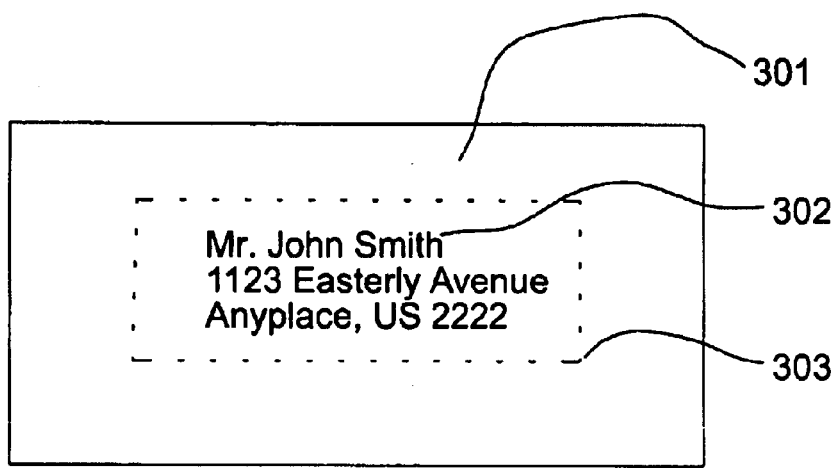
FIG. 11 illustrates a single stamp photonegative for use with a photopolymer method.

FIG. 11 illustrates a single stamp photonegative 301 (shown as a photopositive) with text 302 inside a stamp dimension 303. This is composed on the computer as the data is inputted in step 204 of FIG. 2. When the index card, step 205 of FIG. 2 is produced, the photonegative 301 of FIG. 11 is also produced on special transparent film which is die cut to be large enough to handle the largest stamp contemplated, about 1×3 inches. The text matter 302 is the material which the customer has given for the stamp to print. It is formatted to produce the size and form for making the die and could include graphics. It was found that using an available plastic overhead projector transparency with a laser printer did not produce dense enough blacks unless two sheets were used in series. This worked quite well as long as registration was maintained. For use with a standard laser printer, the envelope feed would be used with two sheets, about 2×4 inches, in series connected by break-off tabs.

Figure 12:
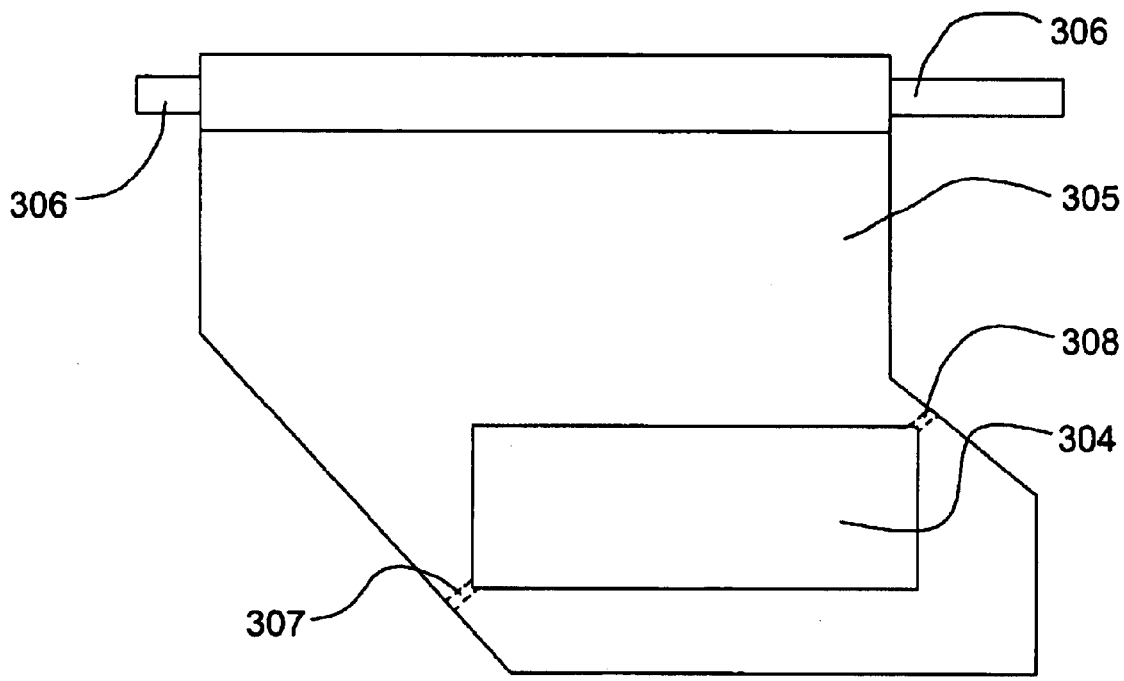
FIG. 12 is a top plan view of a stamp producing cavity plate.
Figure 13:
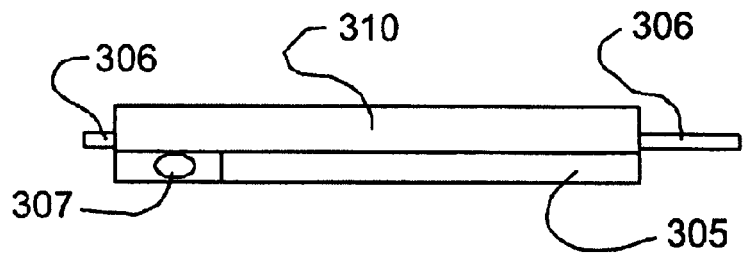
FIG. 13 is a front elevation view of FIG. 12.
Figure 14:
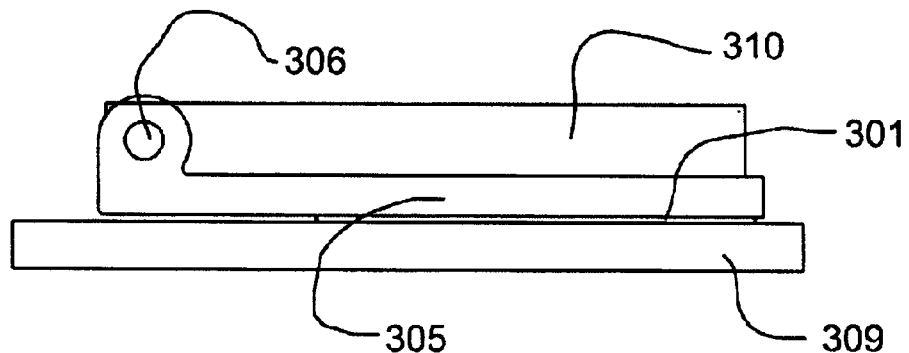
FIG. 14 is a side elevation view of a closed photopolymer gel exposure assembly.
Figure 15:
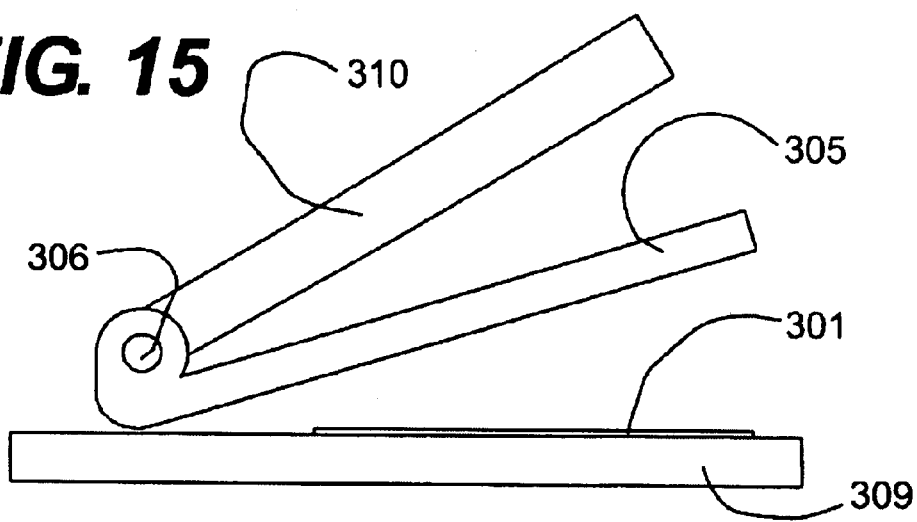
FIG. 15 is a side elevation view of an opened photopolymer gel exposure assembly.
Figure 16:
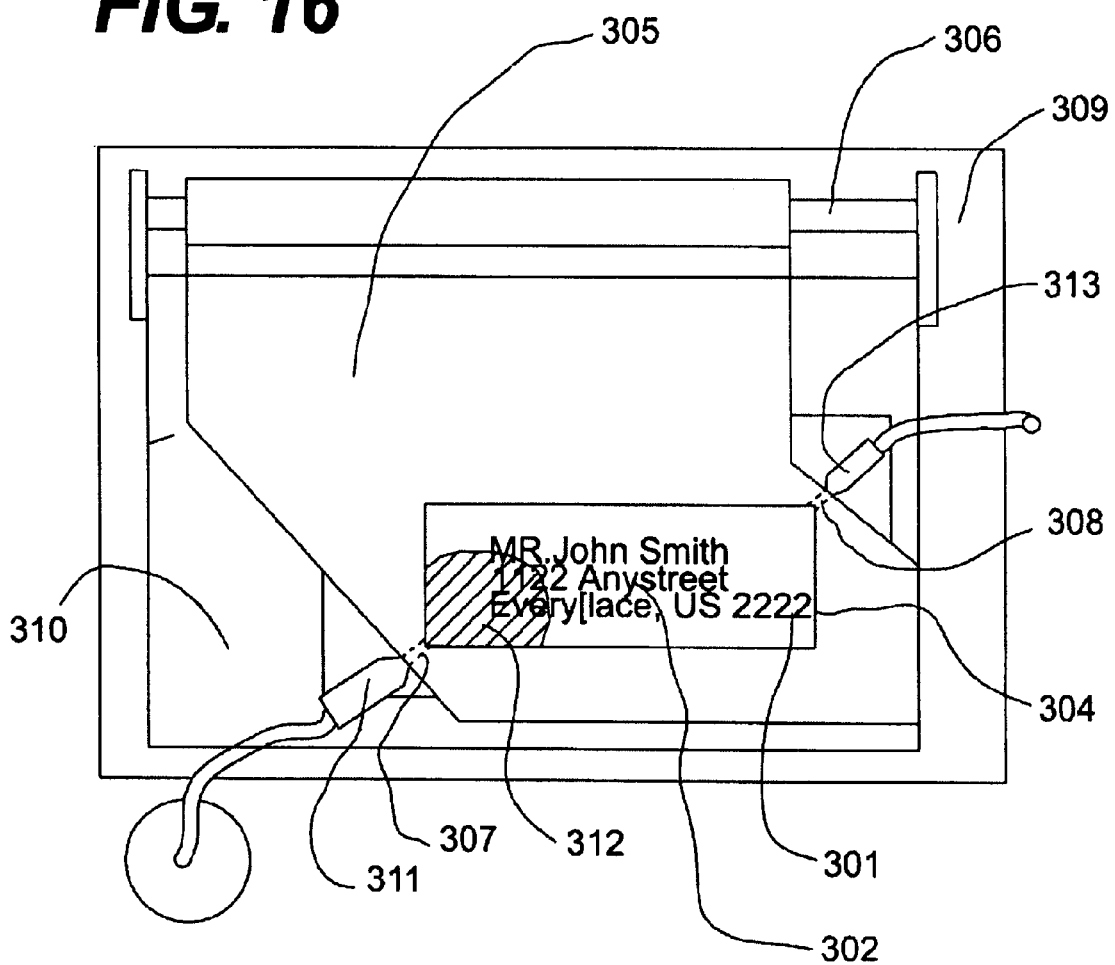
FIG. 16 is a top plan view of FIG. 14 showing photopolymer injection.

FIGS. 12 through 18 illustrate a concept for an assembly based on a simpler assembly that was used to produce working stamp dies. FIG. 12 shows a top plan view of a cavity plate 305. This is a plate whose thickness is the same as the die to be produced, usually about 0.1 to 0.125 inches. This plate 305 has a rectangular hole 304 (as illustrated in FIGS. 12 and 16) which is the exact size of the desired die and will form a cavity when covered. On one long side of the plate is a hinge 306 that is used to rotate a cover. (A hinge was not used in the simpler assembly.) Two holes 307 and 308 are used in filling the cavity. FIG. 13 is a front elevation view of FIG. 12.

FIG. 14 shows in side elevation the exposure assembly consisting of a sandwich of the photonegative 301, the cavity plate 305, a transparent support plate 309, and a transparent cover plate 310. These four elements are arranged by means of the hinge 306 so that the photonegative 301 covers the bottom, in liquid-tight fashion, of the cavity 304. The top of the cavity is covered in liquid tight fashion by the transparent plate 310. In this arrangement, the cavity 304 is a sealed cavity yet is accessible to UV illumination at both top and bottom.

FIG. 15 shows, in side elevation, the opening of the cavity by swinging the top cover 310 and the cavity plate 305 upward so that the photonegative 301 can be inserted and removed. To make a die, the operator raises the cover and cavity plate as shown and inserts the photonegative. (Production versions would include positioning stops, not show here). The operator then closes the exposure assembly and initiates the die making sequence.

FIG. 16 shows a top plan view with partial sections of the exposure assembly during the photopolymer injection stage. An injection nozzle 311 is pressed against the inlet hole 307 in the cavity plate 305. Through a standard feed system well known in the art, injection of the liquid photopolymer into the cavity 304 is commenced. (The photopolymer we used was Ideal Photopolymer #PT4018 from M&R Marking Systems, Inc., Piscataway, N.J.). The liquid photopolymer is about the viscosity of honey and advances steadily as shown in the partial section 312. It is important in injecting the photopolymer that no air which might cause bubbles be entrained in the liquid. We have found that by injecting at one corner and allowing the liquid to advance steadily into the cavity and over the photonegative it will drive the air out of the diagonally opposite exit hole 308 and not entrain any bubbles. At the exit hole 308 is pressed a receiver nozzle 313. When the liquid fills the cavity, injection is stopped and the assembly is now ready for UV exposure. This injection process is accomplished in 10 to 20 seconds. (A production version might include a photodetector at the receive nozzle to automate the filling process.)

Figure 17:
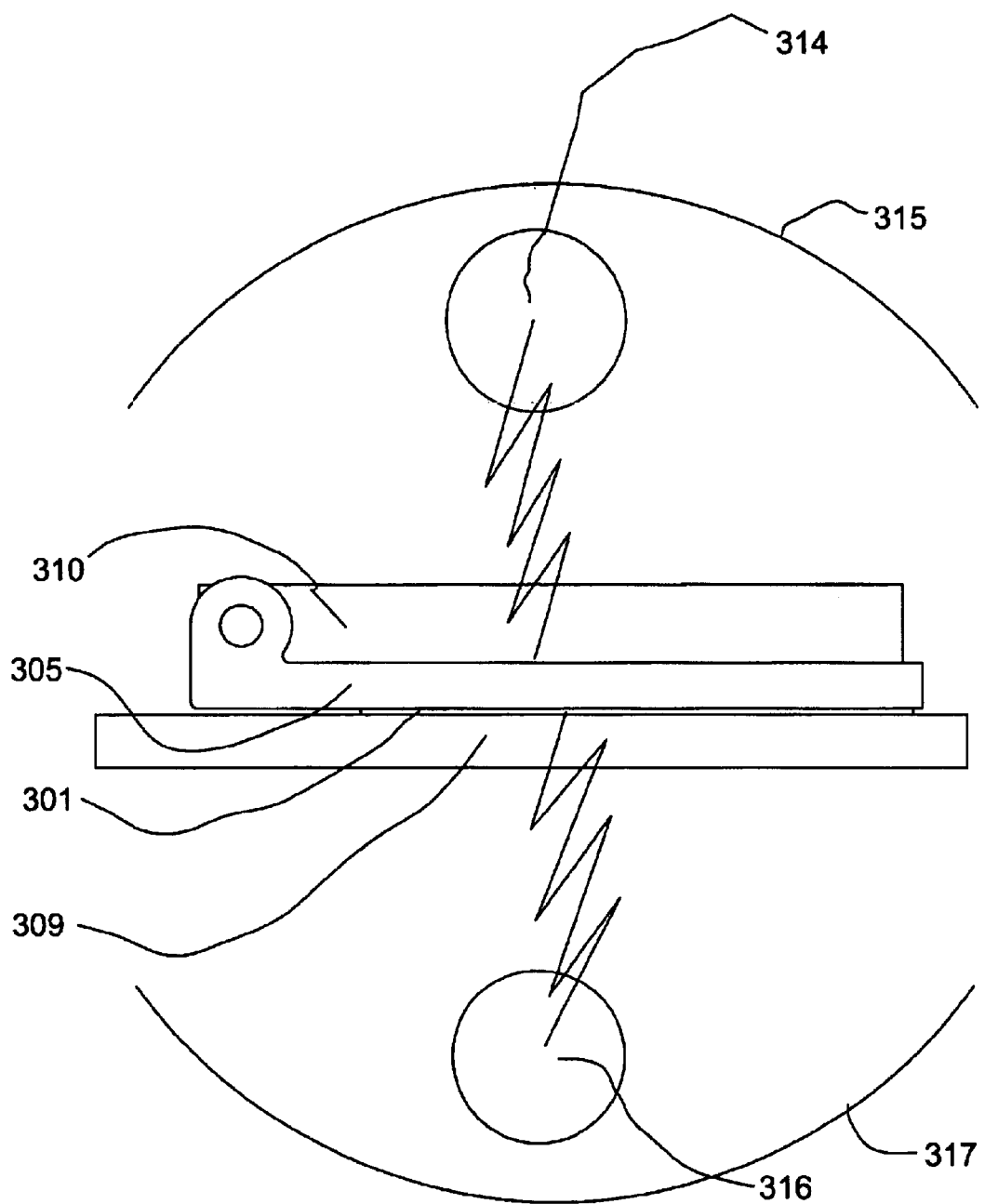
FIG. 17 is a side elevation view of FIG. 14 with UV irradiation.

FIG. 17 shows a side elevation view of the closed exposure assembly with UV lamps 314 and 316 and their respective reflectors 315 and 317 over the top and under the bottom of the assembly. These lamps and their shields are arranged, as is well known in the art, to illuminate both the top and bottom of the die cavity. By conventional controls, the lamps are turned on and off in proper sequence. The sequence is such that by illuminating the photopolymer liquid through the photonegative, the text material is solidified while the surrounding liquid is unaffected and the top liquid is uniformly illuminated so that it forms a solid sheet. The text characters "grow" toward the advancing, solidifying sheet. This produces the customary die plate with the characters attached. This process can be completed in about two minutes thus producing a finished die in about three minutes.

Figure 18:
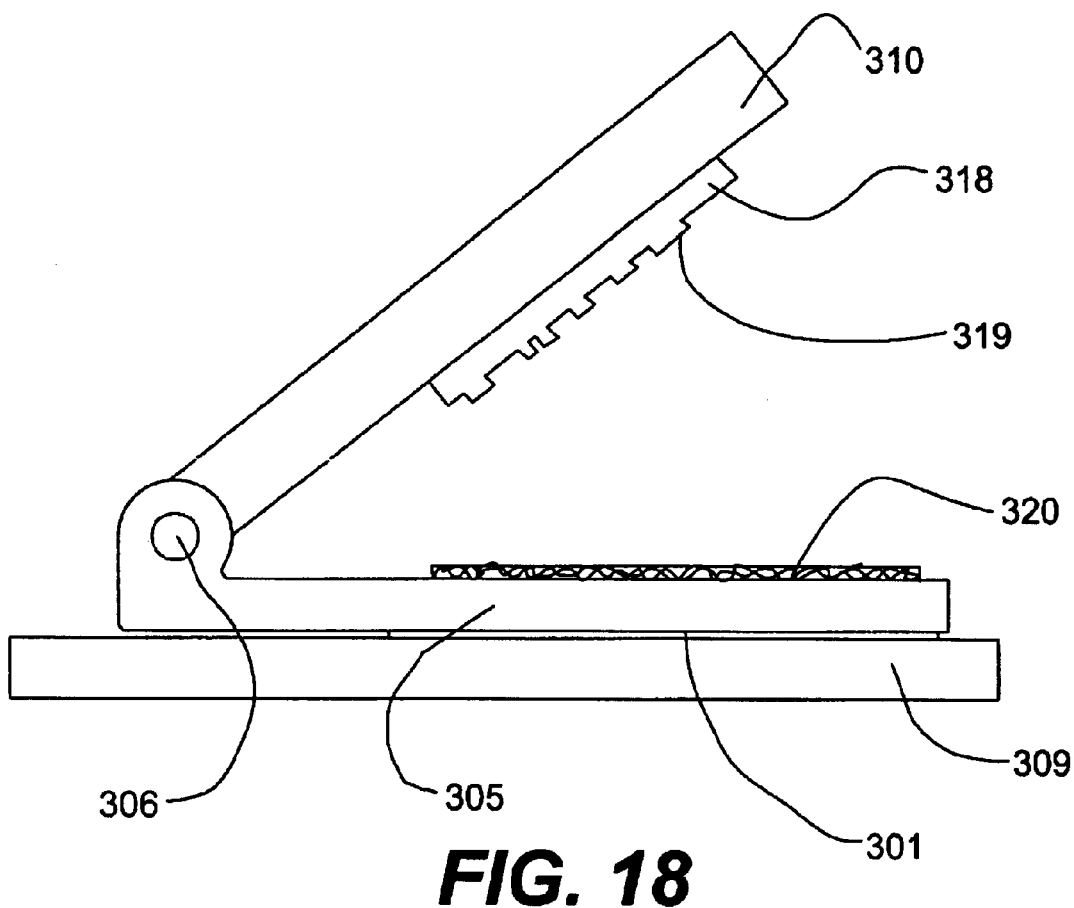
FIG. 18 shows a cured die lifted out of the cavity plate.
Figure 19:
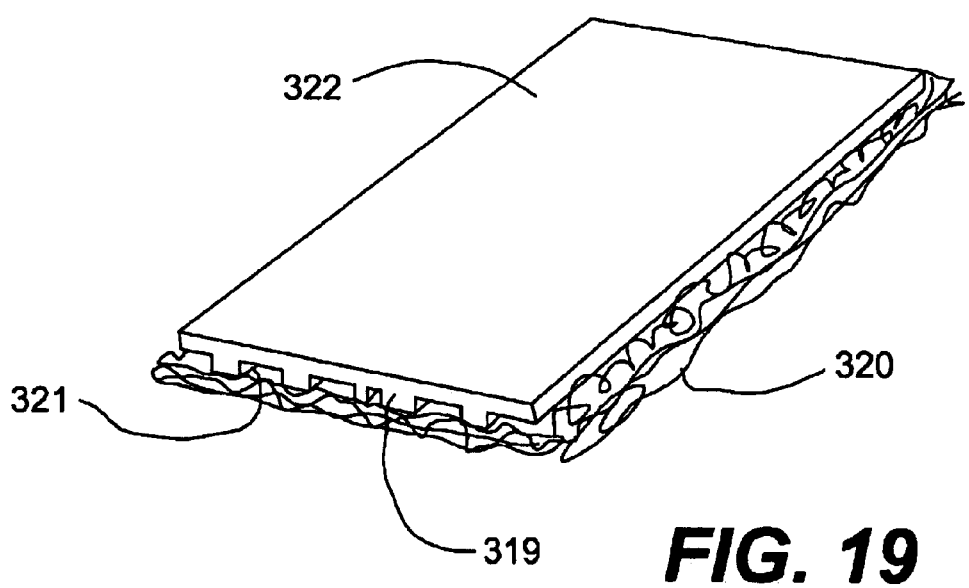
FIG. 19 shows cleaning the die of excess fluid.

FIGS. 18 and 19 show the process after completion of UV exposure. There still remains uncured liquid photopolymer in the spaces 321 between the text 319 on the die 318. In conventional finishing of photopolymer dies in large sheets, these are placed in tubs, rinsed with water, scrubbed with brushes to remove the liquid photopolymer and then dried with towels and hot air. This is a laborious and time consuming operation. We have found that nearly all of this removal process can be eliminated. When the cover plate 310 is raised, it brings with it the finished die 318 because the relatively large solid back 322 is still tacky and separates the relatively smaller solid area text 319 from the photonegative 301 which is still held down by the cavity plate 305. A sheet of inexpensive, absorbent paper 320 is placed over the cavity and under the raised die. The cover plate 310 is then lowered briefly onto the paper. The operator can now grasp the paper and with it the die and lift them away. We have found that about 70% of the uncured liquid photopolymer is removed from the die and absorbed by the paper. The operator then turns the paper and die over, dabs with the paper and discards it. Now about 90% of the liquid has been removed from the spaces between the text 321.

Figure 20:
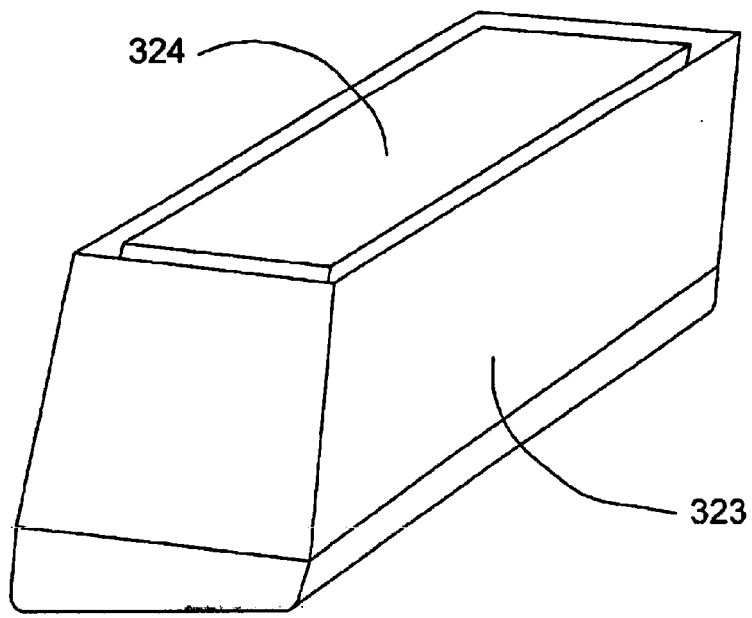
FIG. 20 shows a self-inker stamp body with a platen on which the die is placed.

FIG. 20 shows a self-inker stamp mechanism 323 with a platen 324. The current industry standard approach is to cut up the cleaned and dried photopolymer sheets into type dies and affix them to platens with adhesive. As a result of our method, the flat back 322 of the type die 318 is still in a tacky condition. We have found that, if the die is placed on a dry, clean, styrene platen 324, it will adhere so that no further adhesive is necessary. Furthermore, while this adhesive action is sufficient for the life of the stamp (every time the stamp is used, the die is pressed against the platen), it is sufficiently pliable that if the die happens to be incorrectly placed it can be removed and reapplied without any harm to the die. Although an adhesive could be used as with the current method of cementing dies to platens, the dies generally cannot be removed without damage and must be made over.

Removing uncured liquid with the paper 320 reduces the chances of getting the liquid on the cavity or the operators' hands especially when graphics with large gaps between raised areas are produced. However, we found that it is not necessary to remove the liquid before putting die 318 on the platen 324. The liquid can be totally removed by making several impressions on ordinary paper with the finished stamp. The ink tends to reduce the viscosity of the photopolymer liquid and the stamping action compresses the stamp so that the liquid is forced into contact with the paper. The small amount of uncured liquid that;may remain is not harmful to the stamp or its ink, is biodegradable, and not harmful to humans.

Figure 21:
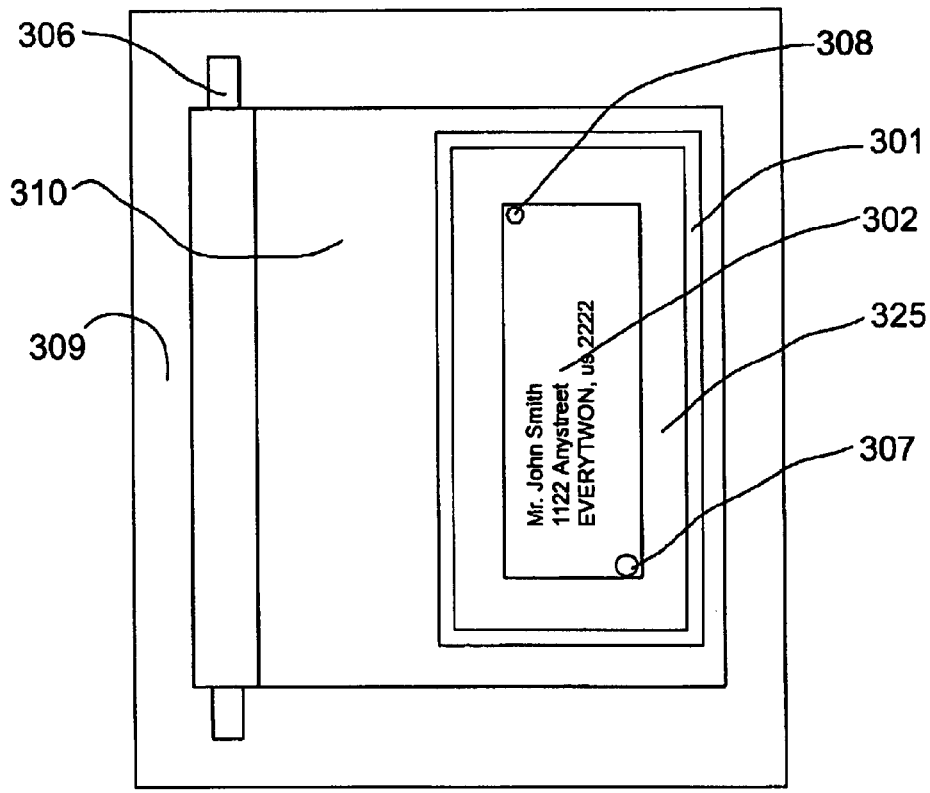
FIG. 21 is a top plan view of a photopolymer gel exposure assembly with a disposable cavity.
Figure 22:
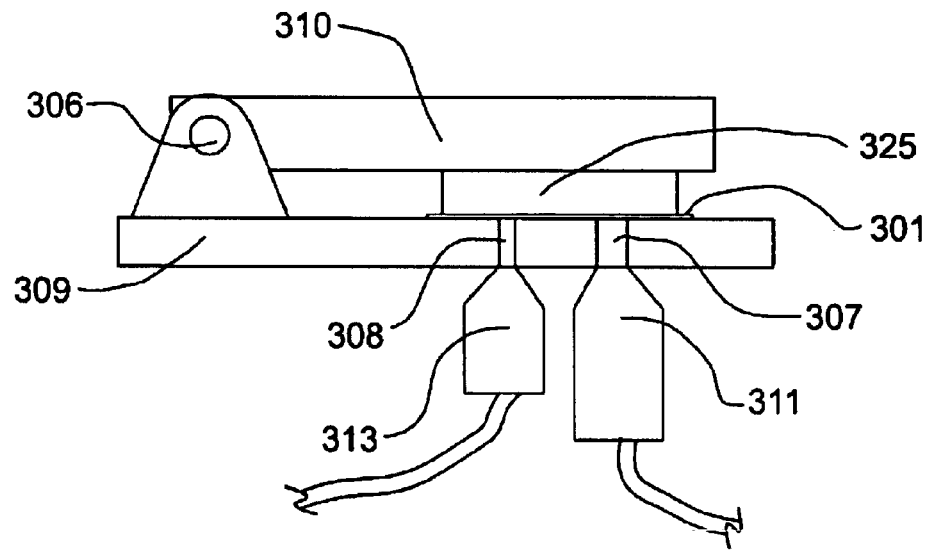
FIG. 22 is a side elevation view of FIG. 21.
Figure 23:
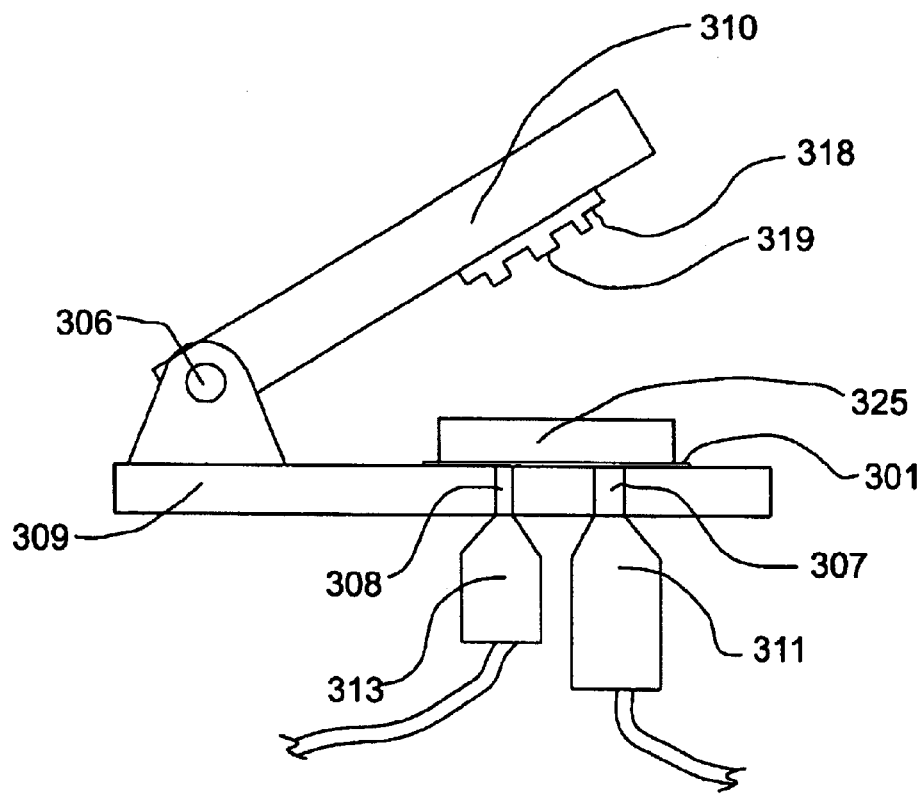
FIG. 23 is a side elevation view of FIG. 21 when opened with a cured die lifted out.

The cavity plate 305 used in the just described method would normally be made out of stainless steel. As an alternative, FIGS. 21, 22, and 23 illustrate an assembly that uses a disposable cavity plate 325. This could be made from inexpensive die-cut cardboard, plastic, and the like. It is not attached to the machine but merely rests upon it or may be glued to the photonegative 301. In this case, the holes 307 and 308 have been moved to the bottom along with the injector 311 and receiver 313. The action of the machine is the same up to the point where the die has been cured by exposure to UV illumination. Also, as before, when the top cover 310 is raised, the die 318 sticks to it. Now, however, the disposable cavity 325 and photonegative 301, along with any uncured, but viscous, liquid, can be thrown away without the need for a clean up. In contrast to the current industry approach, there are no solvents or wastewater to dispose of.

Using a disposable cavity should make the time $t_2$ in FIG. 2 well under five minutes from the time the data is input in step 204. There is more labor involved than with the laser engraver, but the equipment cost is considerably less. It may be possible to save on labor by using an apparatus that has two or more cavities. This would be more useful when customers are placing orders from remote locations and not expecting immediate turnaround.

While preferred embodiments have been described that illustrate the invention, it should be understood that obvious variations will occur to those skilled in the art that are also intended to be included in the scope of the invention as defined by the following claims.

What is claimed is:

1. A method of providing customers with marking stamps of the self-inker type comprising the steps:
   a) inputting type data to a computer;
   b) printing at least one photonegative and placing it optically adjacent to a single die cavity and forming a liquid-tight planar boundary for said cavity;
   c) filling at least one single die cavity with a light curable photopolymer;
   d) exposing said photopolymer through said photonegative to form a marking die; and
   e) removing said masking die from said cavity and placing it on the platen of a self-inker stamp body, whereby a stamp can be finished in about five minutes.

2. The method of claim 1 wherein, in step a, said type data is input to said computer over the Internet.

3. The method of claim 1 wherein, in step a, said type data is input to said computer by a customer in a point-of-sale location whereby the customer can receive a finished stamp in about five minutes.

4. The method of claim 3, further comprising, after step a, the step of printing an index card whereby the customer can check the accuracy of the type data before step b is carried out.

5. The method of claim 1 wherein, in stop b, at least two identical of said photonegatives are produced and superimposed to create a denser photonegative.

6. The method of claim 1 wherein, in step b, non-identical photonegatives are printed and placed in separate single die cavities.

7. The method of claim 1 further comprising the additional step, after step d, of pressing said marking die onto absorbent material to absorb uncured polymer.

8. The method of claim 1 wherein, in step e, an adhesive is used to cement said die to said platen.

9. The method of claim 1 wherein said single die cavity is formed with a non-UV-transmitting disposable cavity plate.

10. The method of claim 9 wherein said disposable cavity plate comprises cardboard.

11. The method of claim 1 wherein in step c, said filling of said cavity is accomplished by injecting said photopolymer through a hole in the side of said cavity and driving air out a substantially opposite hole with said photopolymer.

12. The method of claim 11 wherein, in step d, said photopolymer in said cavity is additionally exposed through a planar side opposite said photonegative.

13. The method of claim 1 wherein, in step d, said photopolymer in said cavity is additionally exposed through a planar side opposite said photonegative side.

* * * * *